US009583338B2

(12) United States Patent
Hashimoto et al.

(10) Patent No.: US 9,583,338 B2
(45) Date of Patent: *Feb. 28, 2017

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Yoshitomo Hashimoto, Toyama (JP); Yoshiro Hirose, Toyama (JP); Tatsuru Matsuoka, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/496,660

(22) Filed: Sep. 25, 2014

(65) Prior Publication Data
US 2015/0111395 A1    Apr. 23, 2015

(30) Foreign Application Priority Data

Oct. 21, 2013  (JP) ................................. 2013-218296

(51) Int. Cl.
*H01L 21/00*   (2006.01)
*H01L 21/02*   (2006.01)
(Continued)

(52) U.S. Cl.
CPC .... *H01L 21/0228* (2013.01); *C23C 16/45527* (2013.01); *C23C 16/45544* (2013.01);
(Continued)

(58) Field of Classification Search
CPC ... H01L 21/02; H01L 21/022; H01L 21/0228; H01L 21/0217; H01L 21/0272;
(Continued)

(56) References Cited

U.S. PATENT DOCUMENTS 8,298,628 B2   10/2012  Yang et al.
8,591,989 B2   11/2013  Chou et al.
(Continued)

FOREIGN PATENT DOCUMENTS

CN    103165410 A    6/2013
JP    2005-012168    1/2005
(Continued)

OTHER PUBLICATIONS

Korean Notice of Preliminary Rejection, KR Application No. 10-2014-0123449, Aug. 4, 2015, 5 pgs. (English translation provided).

(Continued)

*Primary Examiner* — Chuong A Luu
(74) *Attorney, Agent, or Firm* — Volpe and Koenig, P.C.

(57) ABSTRACT

According to the present disclosure, a film containing a predetermined element, carbon and nitrogen is formed with high controllability of a composition thereof. A method of manufacturing a semiconductor device includes forming a film containing a predetermined element, carbon and nitrogen on a substrate by performing a cycle a predetermined number of times. The cycle includes supplying a first processing gas containing the predetermined element and a halogen element to the substrate, supplying a second processing gas composed of three elements of carbon, nitrogen and hydrogen to the substrate, and supplying a third processing gas containing carbon to the substrate.

17 Claims, 10 Drawing Sheets

(51) Int. Cl.
*C23C 16/455* (2006.01)
*C23C 16/52* (2006.01)

(52) U.S. Cl.
CPC ........ *C23C 16/52* (2013.01); *H01L 21/02167* (2013.01); *H01L 21/02211* (2013.01)

(58) Field of Classification Search
CPC ........... H01L 21/0212; H01L 21/02274; H01L 21/02126; H01L 21/02164; H01L 21/31612; H01L 21/02271; H01L 21/3185; H01L 21/6144; H01L 21/00; H01L 21/02172; H01L 21/02211; H01L 21/02167; H01L 21/31; H01L 21/316; H01L 21/314; H01L 21/318; C23C 16/52; C23C 16/455; C23C 16/45531; C23C 16/30; C23C 16/36
USPC ....... 438/794, 763, 778, 787, 584, 758, 730, 438/791, 792, 786, 762
See application file for complete search history.

(56) References Cited

U.S. PATENT DOCUMENTS

| | | | |
|---|---|---|---|
| 8,815,751 | B2 | 8/2014 | Hirose et al. |
| 8,906,455 | B2 | 12/2014 | Yang et al. |
| 9,018,104 | B2 | 4/2015 | Hirose et al. |
| 9,165,761 | B2 | 10/2015 | Hirose et al. |
| 2005/0252449 | A1 | 11/2005 | Nguyen et al. |
| 2006/0286817 | A1 | 12/2006 | Kato et al. |
| 2008/0213479 | A1 | 9/2008 | Chou et al. |
| 2009/0215262 | A1* | 8/2009 | Ramaswamy .......... C23C 16/34 438/653 |
| 2009/0305517 | A1* | 12/2009 | Nakashima ......... C23C 16/4405 438/786 |
| 2010/0210094 | A1* | 8/2010 | Furusawa ............... C23C 16/24 438/493 |
| 2013/0052836 | A1 | 2/2013 | Hirose et al. |
| 2013/0149872 | A1 | 6/2013 | Hirose et al. |
| 2013/0252439 | A1 | 9/2013 | Hirose et al. |
| 2014/0242809 | A1* | 8/2014 | Hashimoto ....... H01L 21/02126 438/778 |

FOREIGN PATENT DOCUMENTS

| | | |
|---|---|---|
| JP | 2007-537360 A | 12/2007 |
| JP | 2008-227460 | 9/2008 |
| JP | 2008-227460 A | 9/2008 |
| JP | 2011-524087 A | 8/2011 |
| JP | 2012-015344 A | 1/2012 |
| JP | 2013-140946 A | 7/2013 |
| JP | 2013-179239 A | 9/2013 |
| WO | 2011-125395 A | 10/2011 |
| WO | 2011-125395 A1 | 10/2011 |
| WO | 2013/027549 A1 | 3/2015 |

OTHER PUBLICATIONS

JP Office Action, JP Patent Application No. 2013-218296, issued 31 Jul. 31, 2015, 2 pgs. (English translation provided).
Taiwanese Office Action, TW Patent Application No. 10-3124130, Nov. 3, 2015, 2 pages (English translation provided).
Japanese Notification of Reasons of Refusal, JP Application No. 2015-229751, Oct. 11, 2016, 4 pages (English translation provided).
Chinese First Office Action, CN Application No. 201410397419.5, Oct. 31, 2016, 8 pages (English translation provided).

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2013-218296, filed on Oct. 21, 2013, the entire contents of which are incorporated herein by reference.

TECHNICAL FIELD

The present disclosure relates to a method of manufacturing a semiconductor device, which includes a process of forming a thin film on a substrate, a substrate processing apparatus, and a recording medium.

BACKGROUND

In manufacturing a semiconductor device, there is a process of forming a silicon-based insulating film such as a silicon nitride film (SiN film), i.e., an insulating film containing silicon as a predetermined element, on a substrate such as a silicon wafer. Since the SiN film has good insulating properties, corrosion resistance, dielectric properties, film stress controllability, and the like, it has been widely used as an insulating film, a mask film, a charge accumulation film, or a stress control film. Also, a technique of forming a silicon carbonitride film (SiCN film) by adding carbon (C) to the insulating film for the purpose of improving etching resistance has been used.

SUMMARY

However, it is difficult to add C into a film such as an SiN film at a high concentration. The present disclosure provides some embodiments of a technique capable of increasing controllability of a composition in a film containing a predetermined element, carbon and nitrogen when the film is formed.

According to an aspect of the present disclosure, there is provided a method of manufacturing a semiconductor device, including forming a film containing a predetermined element, carbon and nitrogen on a substrate by performing a cycle a predetermined number of times, the cycle including: supplying a first processing gas containing the predetermined element and a halogen element to the substrate; supplying a second processing gas composed of three elements of carbon, nitrogen and hydrogen to the substrate; and supplying a third processing gas containing carbon to the substrate.

According to another aspect of the present disclosure, there is provided a substrate processing apparatus, including: a process chamber configured to accommodate a substrate; a first gas supply system configured to supply a first processing gas containing a predetermined element and a halogen element into the process chamber; a second gas supply system configured to supply a second processing gas composed of three elements of carbon, nitrogen and hydrogen into the process chamber; a third gas supply system configured to supply a third processing gas containing carbon into the process chamber; and a control unit configured to control the first gas supply system, the second gas supply system and the third gas supply system to form a film containing the predetermined element, carbon and nitrogen on the substrate in the process chamber by performing a cycle a predetermined number of times, the cycle including: supplying the first processing gas to the substrate in the process chamber; supplying the second processing gas to the substrate in the process chamber; and supplying the third processing gas to the substrate in the process chamber.

According to still another aspect of the present disclosure, there is provided a non-transitory computer-readable recording medium storing a program that causes a computer to perform a process of forming a film containing a predetermined element, carbon and nitrogen on a substrate in a process chamber by performing a cycle a predetermined number of times, the cycle including: supplying a first processing gas containing the predetermined element and a halogen element to the substrate in the process chamber; supplying a second processing gas composed of three elements of carbon, nitrogen and hydrogen to the substrate in the process chamber; and supplying a third processing gas containing carbon to the substrate in the process chamber.

DETAILED DESCRIPTION

Embodiment of the Present Disclosure

Hereinafter, an embodiment of the present disclosure will be described with reference to FIGS. 1 to 3.

(1) Configuration of Substrate Processing Apparatus

Figure 1:
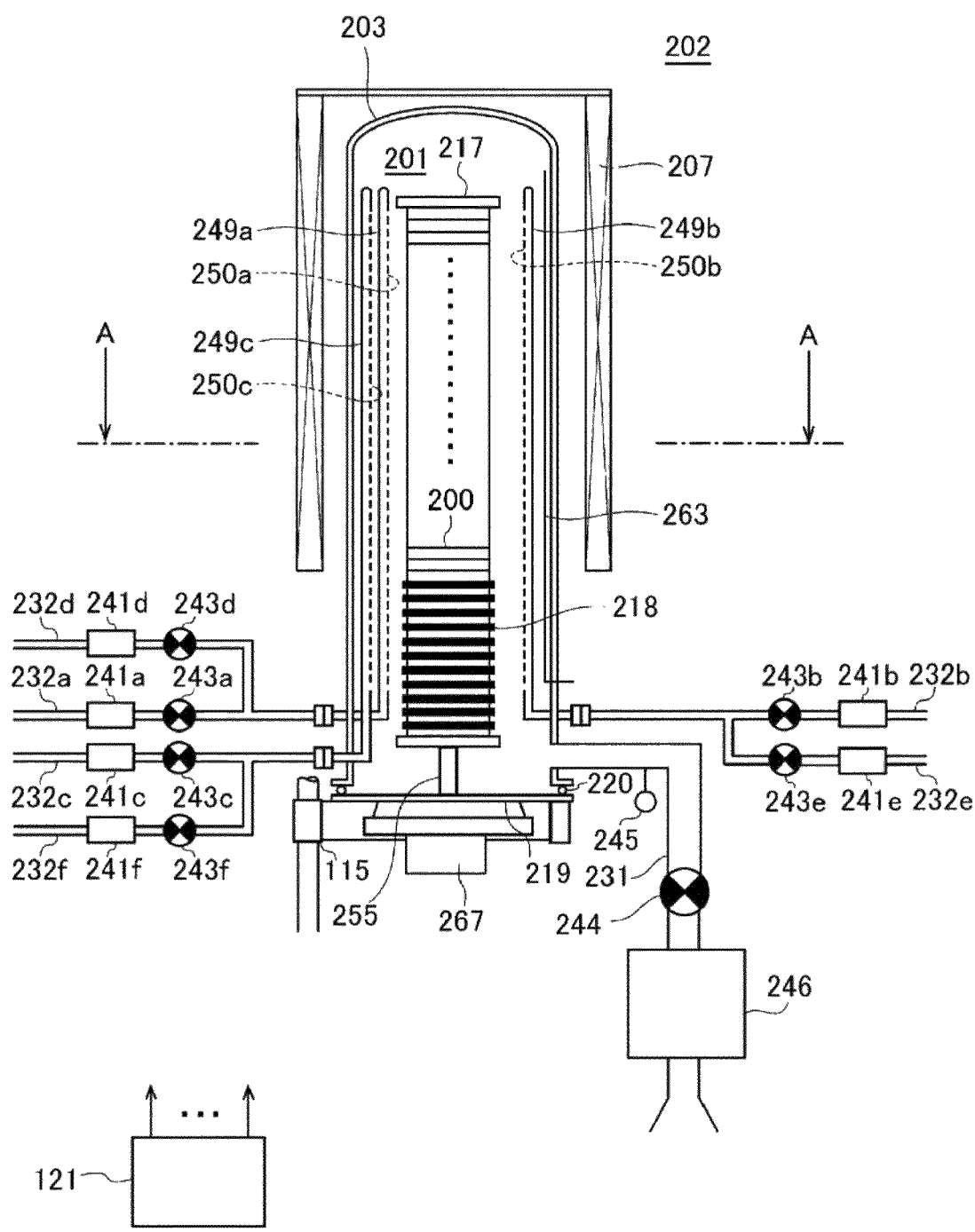
FIG. 1 is a schematic view illustrating a configuration of a vertical processing furnace of a substrate processing apparatus, in which a portion of the processing furnace is shown in a longitudinal sectional view, according to an embodiment of the present disclosure.
Figure 2:
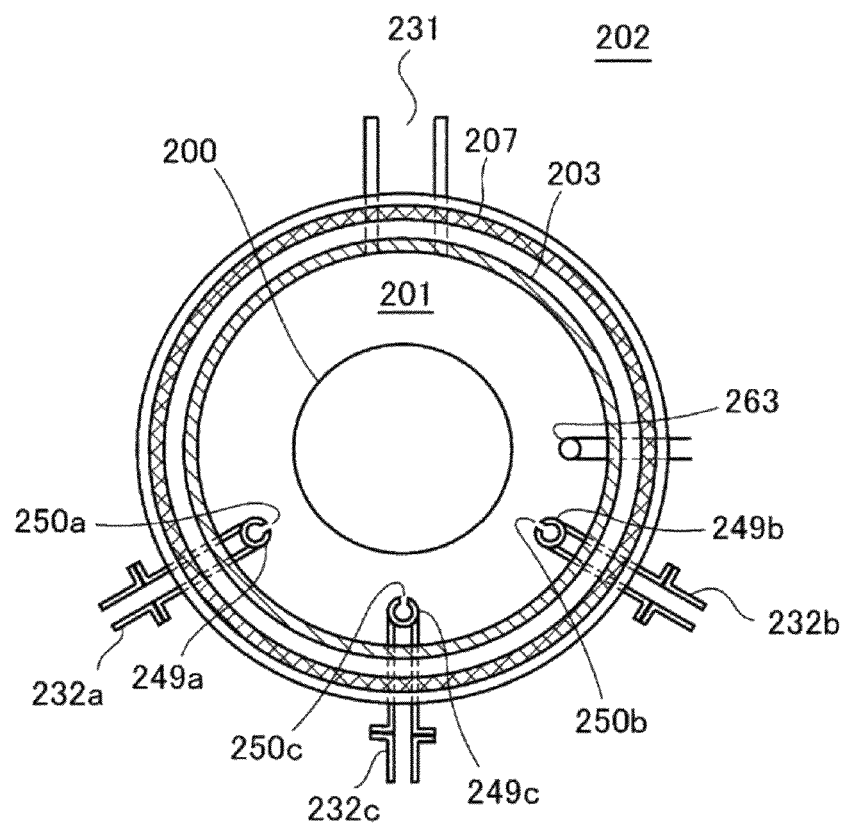
FIG. 2 is a schematic view illustrating a configuration of the vertical processing furnace of the substrate processing apparatus, in which a portion of the processing furnace is shown in a sectional view taken along line A-A in FIG. 1, according to the embodiment of the present disclosure.

As shown in FIG. 1, a processing furnace 202 includes a heater 207 as a heating unit (heating mechanism). The heater 207 has a cylindrical shape and is supported by a heater base (not shown) as a support plate so as to be vertically installed. The heater 207 acts as an activating mechanism (exciting unit) to activate (excite) gas by heat, as will be described later.

A reaction tube 203 defining a reaction vessel (process vessel) is disposed inside the heater 207 in a concentric form along the heater 207. The reaction tube 203 is made of a heat resistant material such as quartz ($SiO_2$) or silicon carbide (SiC), and has a cylindrical shape with its upper end closed and its lower end opened. A process chamber 201 is provided in a hollow cylindrical portion of the reaction tube 203 and is configured to accommodate a plurality of wafers 200, which are horizontally stacked in multiple stages to be aligned in a vertical direction in a boat 217 described later.

Nozzles 249a to 249c are installed in the process chamber 201 so as to penetrate through a lower portion of the reaction tube 203. The nozzles 249a to 249c are connected to gas supply pipes 232a to 232c, respectively. As described above, the three nozzles 249a to 249c and the three gas supply pipes 232a to 232c are installed in the reaction tube 203, and a plurality of types of gases, e.g., three types of gases in this embodiment, may be supplied into the process chamber 201.

However, the processing furnace 202 according to the embodiment is not limited to the above-described type. For example, a manifold (not shown) made of metal which supports the reaction tube 203 may be installed under the reaction tube 203 such that the nozzles penetrate through a sidewall of the manifold. In this case, an exhaust pipe 231 described later may be further installed at the manifold. The exhaust pipe 231 may be installed at a lower portion of the reaction tube 203 rather than at the manifold. In this way, a furnace port of the processing furnace 202 may be formed of metal, and the nozzles may be installed at the metal furnace port.

Mass flow controllers (MFCs) 241a to 241c, which are flow rate controllers (flow rate control parts), and valves 243a to 243c, which are opening/closing valves, are installed in the gas supply pipes 232a to 232c in this order from an upstream direction, respectively. Gas supply pipes 232d to 232f configured to supply an inert gas are connected to the gas supply pipes 232a to 232c at downstream sides of the valves 243a to 243c, respectively. MFCs 241d to 241f, which are flow rate controllers (flow rate control parts), and valves 243d to 243f, which are opening/closing valves, are installed in the gas supply pipes 232d to 232f in this order from an upstream direction, respectively.

The above-described nozzles 249a to 249c are connected to leading ends of the gas supply pipes 232a to 232c, respectively. As shown in FIG. 2, the respective nozzles 249a to 249c are installed in an annular space between an inner watt of the reaction tube 203 and the wafers 200 and vertically disposed along the inner wall of the reaction tube 203 so as to extend upward in a stacking direction of the wafers 200. That is, the respective nozzles 249a to 249c are installed at a side of a wafer arrangement region, in which the wafers 200 are arranged. Each of the nozzles 249a to 249c is configured as an L-shaped long nozzle, and has its horizontal portion installed to penetrate through a lower sidewall of the reaction tube 203 and its vertical portion installed to rise from one end portion of the wafer arrangement region toward the other end portion thereof. A plurality of gas supply holes 250a to 250c through which gases are supplied are formed in side surfaces of the nozzles 249a to 249c, respectively. The gas supply holes 250a to 250c are opened toward a center of the reaction tube 203 to enable gases to be supplied toward the wafers 200, respectively. The gas supply holes 250a to 250c are formed in a plural number from a lower portion to an upper portion of the reaction tube 203, respectively. The gas supply holes 250a to 250c have the same opening area and are disposed at a predetermined opening pitch.

As described above, in the embodiment, a gas may be transferred through the nozzles 249a to 249c disposed in an annular longitudinally extending space, i.e., a cylindrical-shaped space, defined by the inner wall of the reaction tube 203 and end portions (outer peripheries) of the stacked wafers 200. The gas is first ejected into the reaction tube 203 near the wafers 200 through the gas supply holes 250a to 250c opened in the nozzles 249a to 249c, respectively. Thus, a main flow of the gas in the reaction tube 203 follows a direction parallel to surfaces of the wafers 200, i.e., a horizontal direction. With this configuration, the gas can be uniformly supplied to the respective wafers 200, and thus, the film thickness of a thin film formed on a surface of each wafers 200 can be uniform. A residual gas after the reaction flows toward an exhaust port, i.e., the exhaust pipe 231. However, a flow direction of the residual gas is not limited to a vertical direction but may be appropriately adjusted according to a position of the exhaust port.

As a first processing gas containing a predetermined element and a halogen element, for example, a chlorosilane-based precursor gas containing silicon (Si) as the predetermined element and chlorine (Cl) as the halogen element is supplied into the process chamber 201 from the gas supply pipe 232a through the MFC 241a, the valve 243a, and the nozzle 249a.

The chlorosilane-based precursor gas refers to a chlorosilane-based precursor in a gaseous state, for example, a gas obtained by vaporizing a chlorosilane-based precursor that is a liquid state under normal temperature and pressure, a chlorosilane-based precursor that is a gaseous state under normal temperature and pressure, or the like. The chlorosilane-based precursor refers to a silane-based precursor containing a chloro group as a halogen group, and a precursor containing at least Si and Cl. The chlorosilane-based precursor may also be referred to as a type of halide. When the term "precursor" is used herein, it may refer to "a liquid precursor in a liquid state," "a precursor gas in a gaseous state," or both of them. Therefore, when the term "chlorosilane-based precursor" is used herein, it may refer to "a chlorosilane-based precursor in a liquid state," "a chlorosilane-based precursor gas in a gaseous state," or both of them. A hexachlorodisilane ($Si_2Cl_6$, abbreviation: HCDS), for example, may be used as the chlorosilane-based precursor. When a liquid precursor in a liquid state under normal temperature and pressure, such as HCDS, is used, the liquid precursor is vaporized by a vaporization system, such as a vaporizer or a bubbler, and supplied as the first processing gas (HCDS gas).

As a second processing gas composed of three elements of carbon (C), nitrogen (N) and hydrogen (H), for example, a gas containing an amine, i.e., an amine-based gas, is supplied into the process chamber 201 from the gas supply pipe 232b through the MFC 241b, the valve 243b, and the nozzle 249b.

The amine-based gas refers to amine in a gaseous state, for example, a gas obtained by vaporizing the amine in a liquid state under normal temperature and pressure, or a gas containing an amine group such as amine in a gaseous state under normal temperature and pressure. The amine-based gas includes amine such as ethylamine, methylamine, propylamine, isopropylamine, butylamine, and isobutylamine. The amine is a generic name of a compound in which one or more H atoms of ammonia ($NH_3$) are substituted with a hydrocarbon group such as an alkyl group. The amine is a ligand containing a C atom(s) and contains a hydrocarbon group such as an alkyl group. The amine-based gas may be referred to as Si-free gas in that the amine-based gas contains the three elements of C, N and H and does not contain Si. Furthermore, the amine-based gas may also be referred to as Si- and metal-free gas in that the amine-based gas does not contain Si and metal. In addition, the amine-based gas may be a nitrogen-containing gas (nitrogen source), a carbon-containing gas (carbon source) and a hydrogen-containing gas. The amine-based gas may also be referred to as a substance consisting of only the three elements of C, N and H. When the term "amine" is used herein, it may refer to "amine in a liquid state," "amine-based gas in a gaseous state," or both of them. The amine-based gas may include, for example, a triethylamine (($C_2H_5$)$_3$N, abbreviation: TEA) gas, which has three ligands (ethyl groups) containing a C atom(s) in its composition formula (in one molecule in its constitutional formula) in which the C atom(s) is greater than an N atom(s) in number. When the amine such as TEA, which is in a liquid state under normal temperature and pressure, is used, the amine in a liquid state is vaporized by a vaporization system, such as a vaporizer or a bubbler, and supplied as the second processing gas (TEA gas).

As a third processing gas containing carbon (C), for example, a hydrocarbon-based gas, is supplied into the process chamber 201 from the gas supply pipe 232c through the MFC 241c, the valve 243c, and the nozzle 249c. The hydrocarbon-based gas may be a carbon-containing gas (carbon source) and a hydrogen-containing gas. The hydrocarbon-based gas may be referred to as a substance consisting of only two elements of C and H. The hydrocarbon-based gas may include, for example, a propylene ($C_3H_6$) gas.

As an inert gas, for example, a nitrogen ($N_2$) gas is supplied into the process chamber 201 from the gas supply pipes 232d to 232f through the MFCs 241d to 241f, the valves 243d to 243f, the gas supply pipes 232a to 232c, and the nozzles 249a to 249c, respectively.

When the above-described gases flow from the respective gas supply pipes, a first gas supply system configured to supply the first processing gas containing a predetermined element and a halogen element, i.e., a chlorosilane-based precursor gas supply system as the first processing gas supply system, is mainly configured with the gas supply pipe 232a, the MFC 241a, and the valve 243a. The nozzle 249a may also be included in the chlorosilane-based precursor gas supply system. The chlorosilane-based precursor gas supply system may be referred to as a chlorosilane-based precursor supply system.

In addition, a second gas supply system configured to supply the second processing gas composed of the three elements of C, N and H, i.e., an amine-based gas supply system as the second processing gas supply system, is mainly configured with the gas supply pipe 232b, the MFC 241b, and the valve 243b. The nozzle 249b may also be included in the amine-based gas supply system. The amine-based gas supply system may be referred to as an amine supply system.

Further, a third gas supply system configured to supply the third processing gas containing C, i.e., a hydrocarbon-based gas supply system as the third processing gas supply system, is mainly configured with the gas supply pipe 232c, the MFC 241c, and the valve 243c. The nozzle 249c may also be included in the hydrocarbon-based gas supply system. The hydrocarbon-based gas supply system may be referred to as a hydrocarbon supply system.

The exhaust pipe 231 configured to exhaust an internal atmosphere of the process chamber 201 is installed at the reaction tube 203. As shown in FIG. 2, in the transverse sectional view, the exhaust pipe 231 is installed opposite to a side of the reaction tube 203, in which the gas supply holes 250a of the nozzle 249a, the gas supply holes 250b of the nozzle 249b and the gas supply holes 250c of the nozzle 249c are provided, i.e., installed opposite to the gas supply holes 250a to 250c with the wafers 200 therebetween. Also, as shown in FIG. 1, in the longitudinal sectional view, the exhaust pipe 231 is installed below the gas supply holes 250a to 250c. With this configuration, the gases supplied in the vicinity of the wafers 200 in the process chamber 201 from the gas supply holes 250a to 250c flow in the horizontal direction, i.e., in a direction parallel to the surfaces of the wafers 200, flow downward, and then, exhausted through the exhaust pipe 231. The main flow direction of the gases inside the process chamber 201 follows the horizontal direction, as described above.

A vacuum exhaust device, for example, a vacuum pump 246, is connected to the exhaust pipe 231 via a pressure sensor 245, which is a pressure detector (pressure detecting part) for detecting an internal pressure of the process chamber 201, and an APC (Auto Pressure Controller) valve 244, which is a pressure adjuster (pressure adjusting part). The APC valve 244 is configured to perform/stop vacuum exhaust in the process chamber 201 by opening/closing the valve with the vacuum pump 246 actuated, and further to adjust the internal pressure of the process chamber 201 by adjusting a degree of the valve opening based on the pressure information detected by the pressure sensor 245 while operating the vacuum pump 246. An exhaust system is mainly configured with the exhaust pipe 231, the APC valve 244, and the pressure sensor 245. The vacuum pump 246 may be included in the exhaust system.

A seal cap 219, which functions as a furnace port cover configured to hermetically seal a lower end opening of the reaction tube 203, is installed under the reaction tube 203. The seal cap 219 is configured to contact the lower end of the reaction tube 203 from its bottom in the vertical direction. The seal cap 219, for example, may be formed of metal such as stainless steel (SUS) and have a disc shape. An O-ring 220, which is a seal member in contact with the lower end portion of the reaction tube 203, is installed at an upper surface of the seal cap 219. A rotary mechanism 267 configured to rotate the boat 217 is installed opposite to the process chamber 201 with respect to the seal cap 219. A rotary shaft 255 of the rotary mechanism 267 passes through the seal cap 219 to be connected to the boat 217. The rotary mechanism 267 is configured to rotate the wafers 200 by rotating the boat 217. The seal cap 219 is configured to move vertically by a boat elevator 115, which is an elevation mechanism vertically disposed at an outside of the reaction tube 203. The boat elevator 115 is configured to enable the boat 217 to be loaded into or unloaded from the process chamber 201 by elevating or lowering the seal cap 219. The boat elevator 115 is configured as a transfer device (transfer mechanism) that transfers the boat 217, i.e., the wafers 200, into and out of the process chamber 201.

The boat 217, which is used as a substrate support, is configured to support plural sheets, for example, 100 to 200 sheets, of the wafers 200 horizontally stacked in multiple stages, i.e., arranged in spaced relation with each other, with the centers of the wafers 200 concentrically aligned in the vertical direction. The boat 217 is made of, for example, a heat resistant material such as quartz, SiC, or the like. Heat insulating plates 218 formed of a heat resistant material such as quartz, SiC, or the like are horizontally supported in multiple stages at a lower portion of the boat 217 and configured such that the heat from the heater 207 cannot be transferred to the seal cap 219. However, the embodiment is not limited to such a type. For example, instead of the heat insulating plates 218 installed at the lower portion of the boat 217, a heat insulating cylinder consisting of a cylindrical member formed of a heat resistant material such as quartz or SiC may be installed.

A temperature sensor 263, which is a temperature detector, is installed in the reaction tube 203. Based on temperature information detected by the temperature sensor 263, an electrical conduction state to the heater 207 is adjusted such that the interior of the process chamber 201 has a desired temperature distribution. The temperature sensor 263 is configured in an L-shape similar to the nozzles 249a to 249c and installed along the inner wall of the reaction tube 203.

Figure 3:
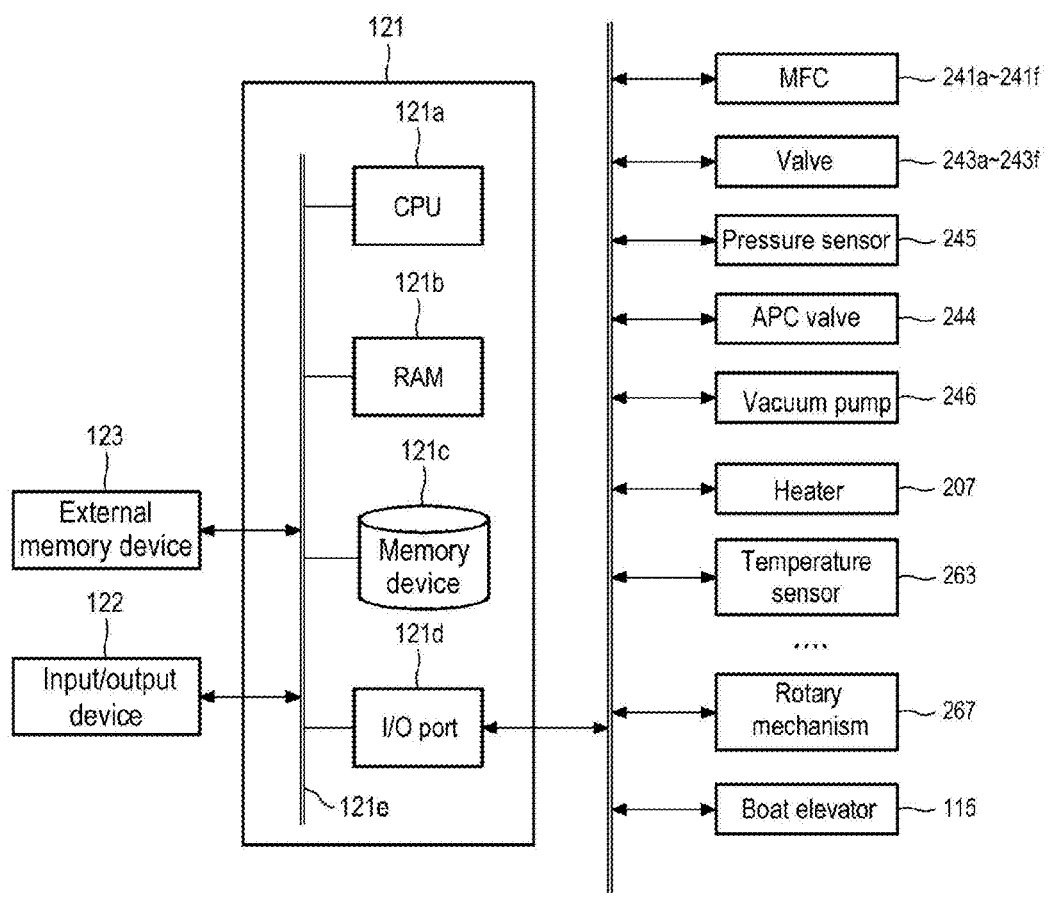
FIG. 3 is a schematic view illustrating a configuration of a controller of the substrate processing apparatus, in which a control system of the controller is shown in a block diagram, according to the embodiment of the present disclosure.

As illustrated in FIG. 3, a controller 121, which is a control unit (control part), is configured as a computer including a CPU (Central Processing Unit) 121a, a RAM (Random Access Memory) 121b, a memory device 121c, and an I/O port 121d. The RAM 121b, the memory device 121c and the I/O port 121d are configured to exchange data with the CPU 121a via an internal bus 121e. An input/output device 122, for example, including a touch panel or the like, is connected to the controller 121.

The memory device 121c is configured with, for example, a flash memory, an HDD (Hard Disc Drive), or the like. A control program for controlling operations of the substrate processing apparatus or a process recipe, in which a sequence or condition for processing a substrate, which will be described later, is written, is readably stored in the memory device 121c. The process recipe functions as a program for the controller 121 to execute each sequence in the substrate processing process, which will be described later, to obtain a predetermined result. Hereinafter, the process recipe or control program may be generally referred to as a program. When the term "program" is used herein, it may indicate a case including only a process recipe, a case including only a control program, or a case including both a process recipe and a control program. The RAM 121b is configured as a memory area (work area) in which a program or data read by the CPU 121a is temporarily stored.

The I/O port 121d is connected to the above-described MFCs 241a to 241f, the valves 243a to 243f, the pressure sensor 245, the APC valve 244, the vacuum pump 246, the heater 207, the temperature sensor 263, the rotary mechanism 267, the boat elevator 115 and the like.

The CPU 121a is configured to read and execute the control program from the memory device 121c. According to an input of an operation command from the input/output device 122, the CPU 121a reads the process recipe from the memory device 121c. In addition, the CPU 121a is configured to control the flow rate adjusting operation of various types of gases by the MFCs 241a to 241f, the opening/closing operation of the valves 243a to 243f, the opening/closing operation of the APC valve 244 and the pressure adjusting operation by the APC valve 244 based on the pressure sensor 245, the temperature adjusting operation of the heater 207 based on the temperature sensor 263, the operation of starting and stopping the vacuum pump 246, the rotation and rotation speed adjusting operation of the boat 217 by the rotary mechanism 267, the elevation operation of the boat 217 by the boat elevator 115, and the like according to contents of the read process recipe.

The controller 121 is not limited to being configured as a dedicated computer but may be configured as a general-purpose computer. For example, the controller 121 according to the embodiment may be configured with preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, a means for supplying a program to a computer is not limited to the case in which the program is supplied through the external memory device 123. For example, the program may be supplied using a communication means such as the Internet or a dedicated line, rather than through the external memory device 123. The memory device 121c or the external memory device 123 is configured as a non-transitory computer-readable recording medium. Hereinafter, these means for supplying the program will be simply referred to as a recording medium. When the term "recording medium" is used herein, it may include a case in which only the memory device 121c is included, a case in which only the external memory device 123 is included, or a case in which both the memory device 121c and the external memory device 123 are included.

(2) Process of Forming Thin Film

Hereinafter, an example of a sequence of forming a film on a wafer 200, which is one of the processes for manufacturing a semiconductor device using the processing furnace 202 of the above-described substrate processing apparatus (or device), will be described. In the following description, operations of the respective parts constituting the substrate processing apparatus are controlled by the controller 121.

In the embodiment, a film containing a predetermined element, carbon and nitrogen is formed on a wafer 200 by performing a cycle a predetermined number of times (one or more times), the cycle including: a process of supplying a first processing gas containing the predetermined element and a halogen element to the wafer 200; a process of supplying a second processing gas composed of three elements of carbon, nitrogen and hydrogen to the wafer 200; and a process of supplying a third processing gas containing carbon to the wafer 200.

Further, in the cycle of the embodiment, the process of supplying the third processing gas is performed during a supply period of the second processing gas.

Hereinafter, the film forming sequence of the embodiment will be described in detail with reference to FIGS. 4 and 5A.

Here, there will be described an example in which a silicon carbonitride film (SiCN film), which is an Si-based insulating film having a predetermined composition and a predetermined film thickness, as a film containing at least Si, C and N, on the wafer 200 by performing a cycle a predetermined number of times (n times), the cycle including: a process of supplying a HCDS gas, which is a chlorosilane-based precursor gas, as the first processing gas, to the wafer 200; a process of supplying a TEA gas, which is an amine-based gas, as the second processing gas, to the wafer 200; and a process of supplying a $C_3H_6$ gas, which is a hydrocarbon-based gas, as the third processing gas, to the wafer 200. Here, there will be described an example in which the process of supplying the $C_3H_6$ gas is performed simultaneously with the process of supplying the TEA gas, i.e., the process of supplying the $C_3H_6$ gas is performed during a supply period of the TEA gas and is not performed during a supply stop period (supply halt period) of the TEA gas.

When the term "wafer" is used herein, it may refer to "the wafer itself" or "a stacked body (a collected body) of the wafer and predetermined layers or films formed on the surface of the wafer," i.e., the wafer including the predetermined layers or films formed on the surface may be referred to as a wafer. In addition, the phrase "a surface of a wafer" as used herein may refer to "a surface (an exposed surface) of a wafer itself" or "a surface of a predetermined layer or film formed on the wafer, i.e., an uppermost surface of the wafer, which is a laminated body."

As used herein, the phrase "a predetermined gas is supplied to a wafer" may mean that "a predetermined gas is directly supplied to a surface (an exposed surface) of a wafer itself" or that "a predetermined gas is supplied to a layer or a film formed on a wafer, i.e., on an uppermost surface of a wafer as a stacked body." Also, "a predetermined layer (or film) is formed on a wafer" may mean that "a predetermined layer (or film) is directly formed on a surface (an exposed surface) of a wafer itself" or that "a predetermined layer (or film) is formed on a layer or a film formed on a wafer, i.e., on an uppermost surface of a wafer as a stacked body."

Moreover, the term "substrate" as used herein may be synonymous with the term "wafer," and in this case, the terms "wafer" and "substrate" may be used interchangeably in the above description.

(Wafer Charging and Boat Loading)

When the plurality of wafers 200 is charged on the boat 217 (wafer charging), as illustrated in FIG. 1, the boat 217 supporting the plurality of wafers 200 is raised by the boat elevator 115 to be loaded into the process chamber 201 (boat loading). In this state, the seal cap 219 seals the lower end of the reaction tube 203 via the O-ring 220.

(Pressure Adjustment and Temperature Adjustment)

The interior of the process chamber 201, i.e., the space in which the wafers 200 are present, is vacuum exhausted by the vacuum pump 246 to a desired pressure (vacuum level). Here, the internal pressure of the process chamber 201 is measured by the pressure sensor 245, and the APC valve 244 is feedback-controlled based on the measured pressure information (pressure adjustment). The vacuum pump 246 maintains a regular operation state at least until processing of the wafers 200 is terminated. Further, the wafers 200 in the process chamber 201 are heated by the heater 207 to a desired temperature. Here, an electrical conduction state to the heater 207 is feedback-controlled based on the temperature information detected by the temperature sensor 263 until the interior of the process chamber 201 reaches a desired temperature distribution (temperature adjustment). In addition, the heating of the interior of the process chamber 201 by the heater 207 is continuously performed at least until processing of the wafers 200 is terminated. Next, the boat 217 and wafers 200 begin to be rotated by the rotary mechanism 267. The rotation of the boat 217 and wafers 200 by the rotary mechanism 267 is continuously performed at least until processing of the wafers 200 is terminated.

(Process of Forming SiCN Film)

Thereafter, the following two steps, i.e., Steps 1 and 2, are sequentially performed.

[Step 1]

(HCDS Gas Supply)

The valve 243a is opened to flow the HCDS gas into the gas supply pipe 232a. The HCDS gas, a flow rate of which is controlled by the MFC 241a, is supplied into the process chamber 201 through the gas supply holes 250a and exhausted through the exhaust pipe 231. As such, the HCDS gas is supplied to the wafer 200. At this time, the valve 243d is opened to flow an $N_2$ gas into the gas supply pipe 232d. The $N_2$ gas, a flow rate of which is controlled by the MFC 241d, is supplied into the process chamber 201 together with the HCDS gas, and exhausted through the exhaust pipe 231.

Here, in order to prevent infiltration of the HCDS gas into the nozzles 249b and 249c, the valves 243e and 243f are opened to flow the $N_2$ gas into the gas supply pipes 232e and 232f. The $N_2$ gas is supplied into the process chamber 201 through the gas supply pipes 232b and 232c and the nozzles 249b and 249c, and exhausted through the exhaust pipe 231.

In this case, the APC valve 244 is appropriately adjusted to set the internal pressure of the process chamber 201 to fall within a range of, for example, 1 to 13,300 Pa, or specifically, for example, 20 to 1,330 Pa. The supply flow rate of the HCDS gas controlled by the MFC 241a is set to fall within a range of, for example, 1 to 1,000 sccm. The supply flow rate of the $N_2$ gas controlled by each of the MFCs 241d to 241f is set to fall within a range of, for example, 100 to 10,000 sccm. A time duration of supplying the HCDS gas to the wafer 200, i.e., a gas supply time (irradiation time), is set to fall within a range of, for example, 1 to 120 seconds, or specifically, for example, 1 to 60 seconds. At this time, a temperature of the heater 207 is set such that a temperature of the wafer 200 falls within a range of, for example, 250 to 700 degrees C., specifically, for example, 300 to 650 degrees C., or more specifically, for example, 350 to 600 degrees C.

If the temperature of the wafer 200 is less than 250 degrees C., the HCDS gas is hardly chemisorbed onto the wafer 200. This sometimes makes it impossible to obtain a practical film forming rate. This problem can be solved by increasing the temperature of the wafer 200 to 250 degrees C. or more. The HCDS gas can be more sufficiently adsorbed onto the wafer 200 by increasing the temperature of the wafer 200 to 300 degrees C. or more, or furthermore 350 degrees C. or more, and a further sufficient film forming rate can be obtained.

When the temperature of the wafer 200 exceeds 700 degrees C., a CVD reaction becomes intense (i.e., a gas phase reaction becomes dominant). Accordingly, the film thickness uniformity may deteriorate, making it difficult to control the film thickness uniformity. By setting the temperature of the wafer 200 to 700 degrees C. or less, such deterioration of the film thickness uniformity can be suppressed, and it becomes possible to control the film thickness uniformity. In particular, by setting the temperature of the wafer 200 to 650 degrees C. or less, or furthermore 600 degrees C. or less, a surface reaction becomes dominant and the film thickness uniformity is easily secured, thereby making it easy to control the film thickness uniformity.

Accordingly, the temperature of the wafer 200 may be set to fall within a range of, for example, 250 to 700 degrees C., specifically, for example, 300 to 650 degrees C., or more specifically, for example, 350 to 600 degrees C.

As the HCDS gas is supplied to the wafer 200 under the above-described conditions, for example, an Si-containing layer containing Cl having a thickness of less than one atomic layer to several atomic layers, as an initial layer containing Si and Cl, is formed on the wafer 200 (a base film of its surface). The Si-containing layer containing Cl may be an Si layer containing Cl, an adsorption layer of the HCDS gas, or both of these.

Here, the phrase "Si layer containing Cl" is a generic name which encompasses a discontinuous layer in addition to a continuous layer formed of Si and containing Cl, and an Si thin film containing Cl formed by laminating such layers.

The continuous layer formed of Si and containing Cl may be referred to as a Si thin film containing Cl. In addition, Si constituting the Si layer containing Cl includes Si, whose bonding to Cl is completely broken, in addition to Si whose bonding to Cl is not completely broken.

The adsorption layer of the HCDS gas may include a discontinuous adsorption layer in which gas molecules of the HCDS gas are discontinuous, in addition to a continuous adsorption layer in which gas molecules of the HCDS gas are continuous. That is, the adsorption layer of the HCDS gas may include an adsorption layer formed of HCDS molecules and having a thickness of one molecular layer or less. The HCDS molecule constituting the adsorption layer of the HCDS gas also includes a molecule in which bonding of Si and Cl is partially broken. That is, the adsorption layer of the HCDS gas includes a physisorption layer of the HCDS gas, a chemisorption layer of the HCDS gas, or both of these.

Here, a layer having a thickness of less than one atomic layer refers to a discontinuously formed atomic layer, and a layer having a thickness of one atomic layer refers to a continuously formed atomic layer. In addition, a layer having a thickness of less than one molecular layer refers to a discontinuously formed molecular layer, and a layer having a thickness of one molecular layer refers to a continuously formed molecular layer.

Under a condition in which the HCDS gas is autolyzed (pyrolyzed), i.e., under a condition in which a pyrolysis reaction of the HCDS gas occurs, Si is deposited on the wafer 200 to form the Si layer containing Cl. Under a condition in which the HCDS gas is not autolyzed (pyrolyzed), i.e., under a condition in which a pyrolysis reaction of the HCDS gas does not occur, the HCDS gas is adsorbed onto the wafer 200 to form the adsorption layer of the HCDS gas. In addition, a film forming rate when the Si layer containing Cl is formed may be greater than that when the adsorption layer of the HCDS gas is formed on the wafer 200.

When the thickness of the Si-containing layer containing Cl formed on the wafer 200 exceeds several atomic layers, an effect of a modification reaction in Step 2, which is described below, is not applied to the entire Si-containing layer containing Cl. In addition, a minimum value of the thickness of the Si-containing layer containing Cl that can be formed on the wafer 200 is less than one atomic layer. Accordingly, the thickness of the Si-containing layer containing Cl may range from less than one atomic layer to several atomic layers. When the thickness of the Si-containing layer containing Cl is one atomic layer or less, i.e., one atomic layer or less than one atomic layer, an effect of the modification reaction in Step 2 described later can be relatively increased, and thus a time required for the modification reaction in Step 2 can be reduced. A time required for forming the Si-containing layer containing Cl in Step 1 can also be reduced. As a result, a processing time per one cycle can be reduced, and thus, a total processing time can also be reduced. As such, the film forming rate can be increased. As the thickness of the Si-containing layer containing Cl is one atomic layer or less, it may become possible to improve controllability of the film thickness uniformity.

(Residual Gas Removal)

After the Si-containing layer containing Cl as the initial layer is formed, the valve 243a is closed to stop the process of supplying the HCDS gas. At this time, while the APC valve 244 of the exhaust pipe 231 is in an open state, the interior of the process chamber 201 is vacuum exhausted by the vacuum pump 246 to remove the residual HCDS gas remaining in the process chamber 201 which does not react or remains after contributing to the formation of the initial layer, from the process chamber 201. In this operation, the process of supplying the $N_2$ gas into the process chamber 201 is maintained by keeping the valves 243d to 243f in an open state. The $N_2$ gas acts as a purge gas. Thus, the residual HCDS gas remaining in the process chamber 201 which does not react or remains after contributing to the formation of the initial layer can be more effectively removed from the process chamber 201.

In this case, the gas remaining in the process chamber 201 may not completely be removed, and the interior of the process chamber 201 may not completely be purged. When the gas remaining in the process chamber 201 is very small in amount, there is no adverse effect generated in the following Step 2. At this time, the amount of the $N_2$ gas supplied into the process chamber 201 need not be large, and for example, approximately the same amount of the $N_2$ gas as the volume of the reaction tube 203 (the process chamber 201) may be supplied to perform the purge such that there is no adverse effect generated in Step 2. As described above, as the interior of the process chamber 201 is not completely purged, the purge time can be reduced, thereby improving the throughput. Further, the consumption of the $N_2$ gas can also be suppressed to a minimal necessity.

The chlorosilane-based precursor gas may include, for example, an inorganic precursor gas, such as tetrachlorosilane, i.e., a silicon tetrachloride ($SiCl_4$, abbreviation: STC) gas, a trichlorosilane ($SiHCl_3$, abbreviation: TCS) gas, a dichlorosilane ($SiH_2Cl_2$, abbreviation: DCS) gas, and a monochlorosilane ($SiH_3Cl$, abbreviation: MCS) gas, in addition to the HCDS gas.

The inert gas may include, for example, a rare gas such as an Ar gas, a He gas, a Ne gas, a Xe gas, and the like, in addition to the $N_2$ gas.

[Step 2]

(TEA Gas and $C_3H_6$ Gas Supply)

After Step 1 is completed and the residual gas in the process chamber 201 is removed, the valve 243b is opened to flow the TEA gas into the gas supply pipe 232b. The TEA gas, a flow rate of which is controlled by the MFC 241b, is supplied into the process chamber 201 through the gas supply holes 250b. At the same time, the valve 243e is opened to flow the $N_2$ gas into the gas supply pipe 232e. The $N_2$ gas, a flow rate of which is controlled by the MFC 241e, is supplied into the process chamber 201 together with the TEA gas.

At the same time, the valve 243c is opened to flow the $C_3H_6$ gas into the gas supply pipe 232c. The $C_3H_6$ gas, a flow rate of which is controlled by the MFC 241c, is supplied into the process chamber 201 through the gas supply holes 250c. At the same time, the valve 243f is opened to flow the $N_2$ gas into the gas supply pipe 232f. The $N_2$ gas, a flow rate of which is controlled by the MFC 241f, is supplied into the process chamber 201 together with the $C_3H_6$ gas.

The TEA gas and the $C_3H_6$ gas supplied into the process chamber 201 are respectively thermally activated (excited), and exhausted through the exhaust pipe 231 together with the $N_2$ gas supplied from the gas supply pipes 232e and 232f. At this time, the thermally activated TEA gas and the thermally activated $C_3H_6$ gas are simultaneously supplied to the wafer 200.

Here, in order to prevent infiltration of the TEA gas and the $C_3H_6$ gas into the nozzle 249a, the valve 243d is opened to flow the $N_2$ gas into the gas supply pipe 232d. The $N_2$ gas is supplied into the process chamber 201 through the gas supply pipe 232a and the nozzle 249a, and exhausted through the exhaust pipe 231.

At this case, the APC valve 244 is appropriately controlled to set the internal pressure of the process chamber 201 to fall within a range of, for example, 1 to 13,300 Pa, or specifically, for example, 399 to 3,990 Pa. As the internal pressure of the process chamber 201 is set to fall within a relatively high pressure range, the TEA gas and the $C_3H_6$ gas can be thermally activated under non-plasma conditions. As the TEA gas and the $C_3H_6$ gas are thermally activated and supplied, a soft reaction can be caused, thereby making it possible to perform the modification described later more softly. A supply flow rate of the TEA gas controlled by the MFC 241b is set to fall within a range of, for example, 100 to 2,000 sccm. A supply flow rate of the $C_3H_6$ gas controlled by the MFC 241c is set to fall within a range of, for example, 100 to 10,000 sccm. A supply flow rate of the $N_2$ gas controlled by each of the MFCs 241d to 241f is set to fall within a range of, for example, 100 to 10,000 sccm. At this time, a partial pressure of the TEA gas in the process chamber 201 is set to fall within a range of, for example, 0.01 to 12,667 Pa. In addition, a partial pressure of the $C_3H_6$ gas in the process chamber 201 is set to fall within a range of, for example, 0.01 to 13,168 Pa. A time duration of a process of supplying the thermally activated TEA gas and the thermally activated $C_3H_6$ gas to the wafer 200, i.e., a gas supply time (irradiation time), is set to fall within a range of, for example, 1 to 120 seconds, or specifically, for example, 1 to 60 seconds. At this time, a temperature of the heater 207 is set, in the same manner as Step 1, such that a temperature of the wafer 200 falls within a range of, for example, 250 to 700 degrees C., specifically, for example, 300 to 650 degrees C., or more specifically, for example, 350 to 600 degrees C.

As the TEA gas is supplied to the wafer 200 under the above-described conditions, the Si-containing layer containing Cl, as the initial layer formed on the wafer 200 in Step 1, may react with the TEA gas. That is, Cl (chloro group) which is the halogen element (halogen group) contained in the Si-containing layer containing Cl as the initial layer may react with ligands (ethyl group) contained in the TEA gas. Accordingly, at least a portion of Cl contained in the initial layer can be extracted (separated) from the initial layer, and at least a portion of a plurality of ethyl groups contained in the TEA gas can be separated from the TEA gas. Then, N contained in the TEA gas where at least a portion of the ethyl groups is separated can be bonded to Si contained in the initial layer. That is, N, which constitutes the TEA gas and has a dangling bond due to removal of at least a portion of the ethyl groups, can be bonded to Si, which is contained in the initial layer to have a dangling bond, or Si, which has had a dangling bond, thereby enabling bonding of Si and N to be formed. At this time, C contained in the ethyl group (—$CH_2CH_3$) separated from the TEA gas and Si contained in the initial layer can be bonded to each other to form bonding of Si and C. As a result, Cl is desorbed from the initial layer and the N component is newly introduced into the initial layer. Here, the C component is also newly introduced into the initial layer.

In addition, as the process of supplying the $C_3H_6$ gas to the wafer 200 is performed simultaneously with the process of supplying the TEA gas to the wafer 200, i.e., the process of supplying the $C_3H_6$ gas is performed at least during the supply period of the TEA gas, the C component contained in the $C_3H_6$ gas is also newly introduced into the initial layer. That is, as the $C_3H_6$ gas is supplied to the wafer 200, the $C_3H_6$ gas is adsorbed onto the surface of the initial layer, and at this time, the C component contained in the $C_3H_6$ gas is also newly introduced into the initial layer. Here, the bonding of Si and C can be formed, for example, by bonding C contained in the $C_3H_6$ gas and Si contained in the initial layer.

As the TEA gas and the $C_3H_6$ gas are supplied under the above-described conditions, since the Si-containing layer containing Cl as the initial layer may appropriately react with the TEA gas and the $C_3H_6$ gas, it is possible to cause the sequence of the above-described reactions. In addition, the sequence of these reactions causes Cl to be desorbed from the initial layer and the N and C components to be newly introduced into the initial layer, such that the Si-containing layer containing Cl as the initial layer is changed (modified) into a layer containing Si, C and N, i.e., a silicon carbonitride layer (SiCN layer). The SiCN layer becomes a layer having a thickness of less than one atomic layer to several atomic layers. The SiCN layer becomes a layer having a relatively high Si and C component ratios, i.e., Si- and C-rich layer.

As described above, not only the C component contained in the TEA gas but also the C component contained in the $C_3H_6$ gas is newly introduced into the SiCN layer. Accordingly, the SiCN layer becomes a layer having a more increased C component ratio, i.e., a C-rich layer, as compared with a layer obtained by modifying the initial layer without supplying the $C_3H_6$ gas to the wafer 200 (a layer obtained by modifying the initial layer with only the TEA gas supplied to the wafer 200).

When the SiCN layer is formed, Cl contained in the initial layer or H contained in the TEA gas or the $C_3H_6$ gas constitutes a substance in a gaseous state containing at least any one of Cl and H in a modification reaction procedure of the initial layer by the TEA gas and the $C_3H_6$ gas, and exhausted out of the process chamber 201 through the exhaust pipe 231. That is, impurities such as Cl contained in the initial layer are extracted or desorbed from the initial layer, thereby being separated from the initial layer. Accordingly, the SiCN layer has fewer impurities such as Cl than the initial layer.

(Residual Gas Removal)

After the SiCN layer is formed, the valves 243b and 243c are closed to stop the process of supplying the TEA gas and the $C_3H_6$ gas, respectively. At this time, while the APC valve 244 of the exhaust pipe 231 is in an open state, the interior of the process chamber 201 is vacuum exhausted by the vacuum pump 246, and the residual gas remaining in the process chamber 201 which does not react or remains after contributing to the formation of the SiCN layer or reaction byproducts are removed from the process chamber 201. In addition, the valves 243d to 243f are in an open state, and the process of supplying the $N_2$ gas into the process chamber 201 is maintained. The $N_2$ gas acts as a purge gas. Thus, the residual gas remaining in the process chamber 201 which does not react or remains after contributing to the formation of the SiCN layer or reaction byproducts can be more effectively removed from the process chamber 201.

In this case, the gas remaining in the process chamber 201 may not completely be removed, and the interior of the process chamber 201 may not completely be purged. When the gas remaining in the process chamber 201 is very small in amount, there is no adverse effect generated in Step 1 performed thereafter. At this time, the amount of the $N_2$ gas supplied into the process chamber 201 need not be large, and for example, approximately the same amount of the $N_2$ gas as the volume of the reaction tube 203 (the process chamber 201) may be supplied to perform the purge such that there is no adverse effect generated in Step 1. As described above, as the interior of the process chamber 201 is not completely purged, the purge time can be reduced, thereby improving the throughput. Further, the consumption of the $N_2$ gas can also be suppressed to a minimal necessity.

The amine-based gas may include, for example, an ethylamine-based gas obtained by vaporizing diethylamine (($C_2H_5$)$_2$NH, abbreviation: DEA), monoethylamine ($C_2H_5NH_2$, abbreviation: MEA) or the like, a methylamine-based gas obtained by vaporizing trimethylamine (($CH_3$)$_3$N, abbreviation: TMA), dimethylamine (($CH_3$)$_2$NH, abbreviation: DMA), monomethylamine ($CH_3NH_2$, abbreviation: MMA) or the like, a propylamine-based gas obtained by vaporizing tripropylamine (($C_3H_7$)$_3$N, abbreviation: TPA), dipropylamine (($C_3H_7$)$_2$NH, abbreviation: DPA), monopropylamine ($C_3H_7NH_2$, abbreviation: MPA) or the like, an isopropylamine-based gas obtained by vaporizing triisopropylamine ([($CH_3$)$_2$CH]$_3$N, abbreviation: TIPA), diisopropylamine ([($CH_3$)$_2$CH]$_2$NH, abbreviation: DIPA), monoisopropylamine (($CH_3$)$_2$CHNH$_2$, abbreviation: MIPA) or the like, a butylamine-based gas obtained by vaporizing tributylamine (($C_4H_9$)$_3$N, abbreviation: TBA), dibutylamine (($C_4H_9$)$_2$NH, abbreviation: DBA), monobutylamine ($C_4H_9NH_2$, abbreviation: MBA) or the like, or an isobutylamine-based gas obtained by vaporizing triisobutylamine ([($CH_3$)$_2$CHCH$_2$]$_3$N, abbreviation: TIBA), diisobutylamine ([($CH_3$)$_2$CHCH$_2$]$_2$NH, abbreviation: DIBA), monoisobutylamine (($CH_3$)$_2$CHCH$_2$NH$_2$, abbreviation: MIBA) or the like, in addition to the TEA gas. That is, the amine-based gas may include, for example, at least one type of gas among the gases obtained by vaporizing ($C_2H_5$)$_x$NH$_{3-x}$, ($CH_3$)$_x$NH$_{3-x}$, ($C_3H_7$)$_x$NH$_{3-x}$, [($CH_3$)$_2$CH]$_x$NH$_{3-x}$, ($C_4H_9$)$_x$NH$_{3-x}$, and [($CH_3$)$_2$CHCH$_2$]$_x$NH$_{3-x}$ (x is an integer number of 1 to 3 in the chemical formulae).

The amine-based gas include a gas composed of three elements of C, N and H and containing a C atom(s) greater than an N atom(s) in number in its composition formula (in one molecule in its constitutional formula). That is, as the amine-based gas, a gas containing at least one amine selected from the group consisting of TEA, DEA, MEA, TMA, DMA, TPA, DPA, MPA, TIPA, DIPA, MIPA, TBA, DBA, MBA, TIBA, DIBA and MIBA may be used.

When the chlorosilane-based precursor gas containing Si and Cl such as the HCDS gas, or the like is used as the first processing gas, and the amine-based gas composed of three elements of C, N and H and containing a C atom(s) greater than an N atom(s) in number in its composition formula such as the TEA gas, the DEA gas, or the like is used as the second processing gas, a concentration of C in the SiCN layer formed in Step 2, i.e., a concentration of C in the SiCN film formed in a process of performing a predetermined number of times which will be described later can be increased.

Contrarily, when the chlorosilane-based precursor gas containing Si and Cl such as the HCDS gas, or the like is used as the first processing gas, and a gas composed of three elements of C, N and H and containing a C atom(s) equal to or less than an N atom(s) in number in its composition formula, such as an amine-based gas such as MMA gas, or the like or an organic hydrazine-based gas such as MMH gas, DMH gas, or the like described later, is used as the second processing gas, a concentration of C in an SiCN layer, i.e., a concentration of C in the SiCN film, cannot be increased as high as the case in which the amine-based gas composed of three elements of C, N and H and containing a C atom(s) greater than an N atom(s) in number in its composition formula is used as the second processing gas, and thus, it is difficult to realize an appropriate C concentration.

In addition, an amine-based gas may include a gas having a plurality of ligands containing C atoms in its composition formula (in one molecule in its constitutional formula), i.e., a gas having a plurality of hydrocarbon groups such as alkyl groups, or the like in its composition formula. Specifically, the amine-based gas may include a gas having three or two ligands containing C atoms (hydrocarbon groups such as alkyl groups, or the like) in its composition formula, for example, a gas containing at least one amine selected from the group consisting of TEA, DEA, TMA, DMA, TPA, DPA, TIPA, DIPA, TBA, DBA, TIBA and DIBA.

When the chlorosilane-based precursor gas containing Si and Cl such as the HCDS gas, or the like is used as the first processing gas, and the amine-based gas composed of three elements of C, N and H and having a plurality of ligands containing C atoms in its composition formula, i.e., the amine-based gas having a plurality of hydrocarbon groups such as alkyl groups, or the like in its composition formula, such as the TEA gas or the DEA gas is used as the second processing gas, a concentration of C in the SiCN layer, i.e., a concentration of C in the SiCN film can be more increased.

Contrarily, when the chlorosilane-based precursor gas containing Si and Cl such as the HCDS gas, or the like is used as the first processing gas, and a gas not having a plurality of ligands containing C atoms in its composition formula, such as an amine-based gas such as the MMA gas, or the like or an organic hydrazine-based gas such as the MMH gas, or the like described later, is used as the second processing gas, a concentration of C in an SiCN layer, i.e., a concentration of C in the SiCN film cannot be increased as high as the case in which the amine-based gas having a plurality of ligands containing C atoms in its composition formula is used as the second processing gas, and thus, it is difficult to realize an appropriate C concentration.

In addition, as an amine-based gas having two ligands containing C atoms in its composition formula such as the DEA gas is used as the second processing gas, it is possible to improve a cycle rate (a thickness of an SiCN layer formed per unit cycle) and also to increase a ratio of an N concentration to a C concentration (N concentration/C concentration ratio) in the SiCN layer, i.e., a ratio of an N concentration to a C concentration (N concentration/C concentration ratio) in the SiCN film, as compared with the case in which an amine-based gas having three ligands containing C atoms in its composition formula such as the TEA gas, or the like is used.

Contrarily, as the amine-based gas having three ligands containing C atoms in its composition formula such as the TEA gas, or the like is used as the second processing gas, it is possible to increase a ratio of an C concentration to a N concentration (C concentration/N concentration ratio) in the SiCN layer, i.e., a ratio of an C concentration to a N concentration (C concentration/N concentration ratio) in the SiCN film, as compared with the case in which the amine-based gas having two ligands containing C atoms in its composition formula such as the DEA gas, or the like is used.

That is, the number of ligands containing C atoms contained in the second processing gas (the number of hydrocarbon groups such as alkyl groups, or the like), i.e., an appropriate change of a gas type of the second processing gas, makes it possible to finely control a cycle rate or a concentration of N or C in the SiCN film.

In addition, the third processing gas may include, for example, a hydrocarbon-based gas, such as an acetylene ($C_2H_2$) gas or an ethylene ($C_2H_4$) gas, in addition to the $C_3H_6$ gas. That is, a gas consisting of two elements of C and H, i.e., an N-free, carbon-containing gas, as the third processing gas may be used.

As a hydrocarbon-based gas containing one or more C atoms and no N atom in its composition formula (in one molecule in its constitutional formula) such as the $C_3H_6$ gas is used as the third processing gas, it is possible to prevent an N component originated from the third processing gas from being added into the initial layer, i.e., the SiCN layer, when the third processing gas is supplied to the wafer 200 in Step 2. That is, only the second processing gas can be used as a nitrogen source when an N component is added into the SiCN layer. As a result, it is possible to suppress an increase in a concentration of N in the SiCN film formed in a process of performing a predetermined number of times which will be described later and to increase a concentration of C therein.

As described above, by appropriately selecting the gas type (composition) of the second processing gas or the gas type (composition) of the third processing gas, respectively, it is possible to increase a concentration of C in the SiCN film.

Here, in order to increase a concentration of C in the SiCN film, for example, the internal pressure of the process chamber 201 when the TEA gas and the $C_3H_6$ gas are simultaneously supplied to the wafer 200 may be set to be higher than the internal pressure of the process chamber 201 when the HCDS gas is supplied to the wafer 200 in Step 1. That is, assuming that the internal pressure of the process chamber 201 when the HCDS gas is supplied to the wafer 200 is $P_1$ [Pa] and the internal pressure of the process chamber 201 when the TEA gas and the $C_3H_6$ gas are supplied to the wafer 200 is $P_2$ [Pa], the pressures $P_1$ and $P_2$ may be set to meet a relationship of $P_2 > P_1$. The adsorption of the hydrocarbon-based gas such as the $C_3H_6$ gas, or the like onto the initial layer tends to be relatively difficult. However, if the internal pressure of the process chamber 201 is set as described above in Steps 1 and 2, the adsorption of the $C_3H_6$ gas onto the initial layer can be promoted and the reaction of the initial layer and the TEA gas can also be promoted. As a result, the concentration of C in the SiCN layer formed in Step 2, i.e., the concentration of C in the SiCN film, can be more increased.

Contrarily, in order to appropriately suppress an increase in the concentration of C in the SiCN film, the internal pressure of the process chamber 201 when the TEA gas and the $C_3H_6$ gas are supplied to the wafer 200 may be set to be equal to or lower than the internal pressure of the process chamber 201 when the HCDS gas is supplied to the wafer 200 in Step 1. That is, the above-described pressures $P_1$ and $P_2$ may be set to meet a relationship of $P_1 \geq P_2$.

That is, by appropriately controlling the internal pressure of the process chamber 201 when the TEA gas and the $C_3H_6$ gas are supplied to the wafer 200, i.e., appropriately controlling the internal pressure of the process chamber 201 in the process of supplying the $C_3H_6$ gas or the internal pressure of the process chamber 201 in the process of supplying the TEA gas, it is possible to finely control the concentration of C in the SiCN film.

In addition, the concentration of C in the SiCN film can be finely controlled not only by controlling the internal pressure of the process chamber 201 when the TEA gas and the $C_3H_6$ gas are supplied to the wafer 200 as described above but also by controlling supply conditions such as a supply time or supply flow rates of the TEA gas and the $C_3H_6$ gas.

For example, by increasing the gas supply time in which the TEA gas and the $C_3H_6$ gas are supplied in Step 2 or the supply flow rates of the TEA gas and the $C_3H_6$ gas, it is possible to further increase the concentration of C in the SiCN film. In addition, for example, by increasing a ratio of the supply flow rate of the $C_3H_6$ gas to the supply flow rate of the TEA gas, i.e., by setting a partial pressure of the $C_3H_6$ gas in the process chamber 201 to be higher than a partial pressure of the TEA gas therein, it is possible to increase the concentration of C in the SiCN film.

Further, for example, by decreasing the gas supply time in which the TEA gas and the $C_3H_6$ gas are supplied in Step 2 or the supply flow rates of the TEA gas and the $C_3H_6$ gas, it is possible to appropriately suppress an increase in the concentration of C in the SiCN film. In addition, for example, by decreasing a ratio of the supply flow rate of the $C_3H_6$ gas to the supply flow rate of the TEA gas, i.e., by setting the partial pressure of the $C_3H_6$ gas in the process chamber 201 to be lower than the partial pressure of the TEA gas therein, it is possible to appropriately suppress an increase in the concentration of C in the SiCN film.

As described above, by adjusting the supply conditions (gas supply time, supply flow rate, partial pressure, internal pressure of the process chamber 201 and the like) in the process of supplying the TEA gas and the $C_3H_6$ gas, it is possible to finely control the concentration of C in the SiCN film.

The inert gas may include, for example, a rare gas such as an Ar gas, a He gas, a Ne gas, a Xe gas, and the like, in addition to the $N_2$ gas.

(Performing Predetermined Number of Times)

The above-described Steps 1 and 2 may be set as one cycle and the cycle may be performed one or more times (a predetermined number of times), thereby forming an SiCN film having a predetermined composition and a predetermined film thickness on the wafer 200. The above-described cycle may be repeated a plurality number of times. That is, it is possible that a thickness of the SiCN layer formed per cycle is set to be smaller than a desired film thickness, and the above-described cycle may be repeated a plurality number of times until the desired film thickness is obtained.

When the cycle is performed a plurality number of times, the phrase "a predetermined gas is supplied to the wafer 200" in each step after at least two cycles may mean that a predetermined gas is supplied to a layer formed on the wafer 200, i.e., the uppermost surface of the wafer 200, which is a laminated body. The phrase "a predetermined layer is formed on the wafer 200" means that the predetermined layer is formed on a layer formed on the wafer 200, i.e., the uppermost surface of the wafer 200, which is a laminated body. Also, above-described matters are similar in respective modifications and other embodiments which will be described later.

(Purge and Return to Atmospheric Pressure)

When the SiCN film having the predetermined composition and the predetermined film thickness has been formed, the valves 243d to 243f are opened and the $N_2$ gas is supplied from the gas supply pipes 232d to 232f into the process chamber 201, respectively, and exhausted through the exhaust pipe 231. The $N_2$ gas acts as a purge gas and the interior of the process chamber 201 is purged with the inert gas, so that the gas remaining in the process chamber 201 or reaction byproducts are removed from the process chamber 201 (purge). Subsequently, the internal atmosphere in the process chamber 201 is substituted with the inert gas (inert gas substitution), and the internal pressure of the process chamber 201 returns to normal pressure (return to atmospheric pressure).

(Boat Unload and Wafer Discharge)

Thereafter, the seal cap 219 is lowered by the boat elevator 115 to open the lower end of the reaction tube 203, and the processed wafer 200 supported by the boat 217 is unloaded to the outside of the reaction tube 203 through the lower end of the reaction tube 203 (boat unload). Then, the processed wafer 200 is discharged from the boat 217 (wafer discharge).

(3) Effects According to the Present Embodiment

According to the present embodiment, one or more effects may be provided as described below.

(a) By performing the process of supplying the hydrocarbon-based gas ($C_3H_6$ gas) as the third processing gas to the wafer 200 simultaneously with the process of supplying the amine-based gas (TEA gas) as the second processing gas to the wafer 200, i.e., by performing the process of supplying the $C_3H_6$ gas at least during the supply period of the TEA gas, it is possible to newly add not only the C component contained in the amine-based gas but also the C component contained in the $C_3H_6$ gas into the SiCN layer. That is, as the film formation is performed using the two types of carbon sources (double carbon sources) in one cycle, it is possible to newly add not only the C component contained in the TEA gas but also the C component contained in the $C_3H_6$ gas into the SiCN film. Accordingly, the concentration of C in the SiCN film can be increased. That is, it is possible to increase the concentration of C in the SiCN film as compared with a case in which a film formation is performed using one of the carbon sources (a single carbon source) in one cycle.

(b) By performing the process of supplying the $C_3H_6$ gas to the wafer 200 simultaneously with the process of supplying the TEA gas to the wafer 200, the time required to perform one cycle can be reduced as compared with a case in which these processes are separately performed. Accordingly, since a reduction in throughput when the SiCN film is formed can be avoided, it is possible to prevent the productivity of the film formation from being lowered.

(c) As the hydrocarbon-based gas containing one or more C atoms and no N atom in its composition formula is used as the third processing gas, it is possible to prevent an N component originated from the third processing gas from being added into the SiCN layer when the third processing gas is supplied to the wafer 200 in Step 2. Accordingly, while suppressing an increase in the concentration of N in the SiCN film, the concentration of C therein can be easily increased.

(d) By appropriately adjusting the supply conditions (gas supply time, supply flow rate, internal pressure of the process chamber 201, partial pressure of the $C_3H_6$ gas and the like) in the process of supplying the TEA gas and the $C_3H_6$ gas, it is possible to finely control the concentration of C in the SiCN film.

For example, by setting the internal pressure of the process chamber 201 in the process of supplying the TEA gas and the $C_3H_6$ gas to the wafer 200 in Step 2 to be higher than the internal pressure of the process chamber 201 in the process of supplying the HCDS gas to the wafer 200 in Step 1, it is possible to more increase the concentration of C in the SiCN film.

In addition, for example, by increasing the gas supply time of the TEA gas and the $C_3H_6$ gas in the process of supplying the TEA gas and the $C_3H_6$ gas in Step 2, or increasing the supply flow rates of the TEA gas and the $C_3H_6$ gas therein, it is possible to more increase the concentration of C in the SiCN film. Further, for example, by increasing a ratio of the supply flow rate of the $C_3H_6$ gas to the supply flow rate of the TEA gas ($C_3H_6$ gas supply flow rate/TEA gas supply flow rate) in the process of supplying the TEA gas and the $C_3H_6$ gas, i.e., by increasing the partial pressure of the $C_3H_6$ gas in the process chamber 201 to be higher than the partial pressure of the TEA gas therein, it is possible to suppress an increase in the concentration of N in the SiCN film and to efficiently increase the concentration of C therein.

Furthermore, for example, by decreasing the gas supply time of the TEA gas and the $C_3H_6$ gas or decreasing the supply flow rates of the TEA gas and the $C_3H_6$ gas in the process of supplying the TEA gas and the $C_3H_6$ gas in Step 2, it is possible to appropriately suppress an increase in the concentration of C in the SiCN film. In addition, for example, by decreasing a ratio of the supply flow rate of the $C_3H_6$ gas to the supply flow rate of the TEA gas ($C_3H_6$ gas supply flow rate/TEA gas supply flow rate), i.e., by decreasing the partial pressure of the $C_3H_6$ gas in the process chamber 201 to be lower than the partial pressure of the TEA gas, it is possible to appropriately suppress an increase in the concentration of C in the SiCN film.

(e) As the TEA gas, which consists of the three elements of C, N and H and is the Si- and metal-free amine-based gas, is used as the second processing gas, it is possible to improve the reaction controllability, particularly, the composition controllability, when the SiCN film is formed. That is, in the film forming sequence of the embodiment in which the TEA gas is used as the second processing gas, it is possible to improve the reaction controllability, particularly the composition controllability, when the SiCN layer is formed by reacting the second processing gas with the initial layer, as compared with a film forming sequence in which for example, a tetrakis(ethylmethylamino)hafnium (Hf[N($C_2H_5$)($CH_3$)]$_4$, abbreviation: TEMAH) gas or the like consisting four elements of hafnium (Hf), C, N and H is used as the second processing gas. Accordingly, the composition control of the SiCN film can be easily performed.

(f) As the TEA gas, which consists of the three elements of C, N and H and is the Si- and metal-free amine-based gas, is used as the second processing gas, it is possible to decrease a concentration of impurities in the SiCN film. That is, in the film forming sequence of the embodiment in which the TEA gas is used as the second processing gas, since the probability that the impurity elements are added to the SiCN layer formed by the reaction of the second processing gas and the initial layer can be reduced, it is possible to reduce the concentration of impurities in the SiCN film, as compared with a film forming sequence in which for example, the TEMAH gas or the like consisting four elements of Hf, C, N and H is used as the second processing gas.

(g) As the TEA gas, which consists of the three elements of C, N and H and is the Si- and metal-free amine-based gas, is used as the second processing gas, it is possible to respectively improve an in-plane film thickness uniformity of the SiCN film of the wafer 200 and an inter-plane film thickness uniformity of the SiCN films of the wafers 200. That is, since the TEA gas consisting of the three elements of C, N and H has a high reactivity to the Si-containing layer containing Cl, for example, as compared with the TEMAH gas or the like consisting of the four elements of Hf, C, N and H, in the film forming sequence of the embodiment in which the TEA gas is used as the second processing gas, the reaction of the second processing gas and the initial layer can be securely and uniformly performed in the surface of the wafer 200 and among the surfaces of the wafers 200. As a result, it is possible to respectively improve the in-plane film thickness uniformity of the SiCN film of the wafer 200 and the inter-plane film thickness uniformity of the SiCN films of the wafers 200.

(Modifications)

Figure 4:
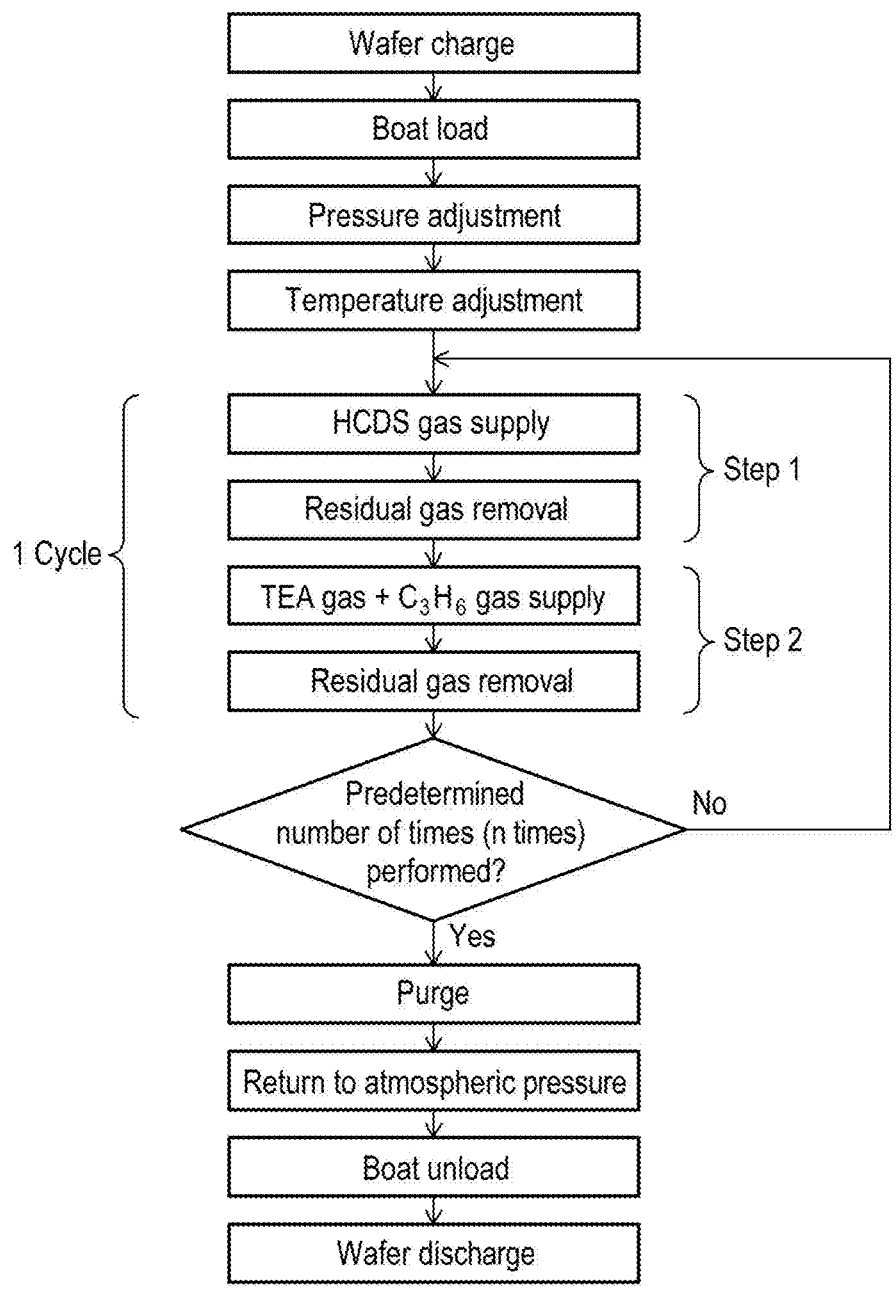
FIG. 4 is a view illustrating a flow of film formation in the embodiment of the present disclosure.
Figure 5A:
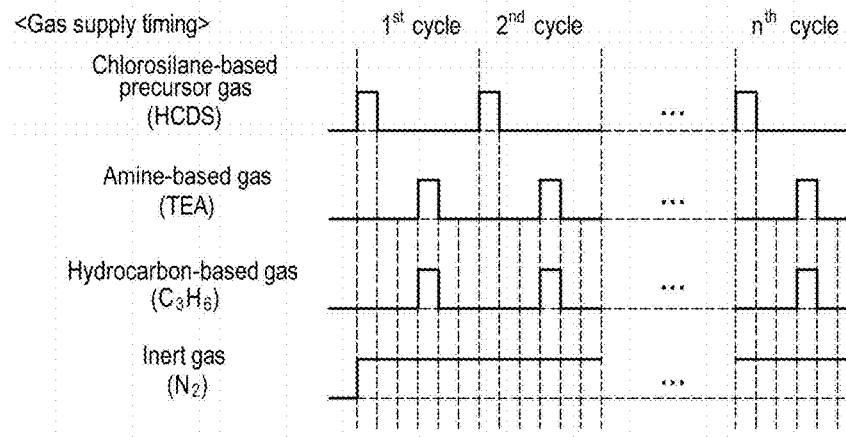
FIG. 5A is a view illustrating gas supply timings in a film forming sequence according to the embodiment of the present disclosure and FIG. 5B is a view illustrating gas supply timings in film forming sequences according to modifications thereof.

In the above-described film forming sequence shown in FIGS. 4 and 5A, an example, in which the process of supplying the hydrocarbon-based gas ($C_3H_6$ gas) as the third processing gas is performed simultaneously with the process of supplying the amine-based gas (TEA gas) as the second processing gas, i.e., the process of supplying the $C_3H_6$ gas is performed during the supply period of the TEA gas and is not performed during the supply stop period of the TEA gas, was described. However, the film forming sequence according to the embodiment is not limited to this type and may also be modified.

Figure 5B:
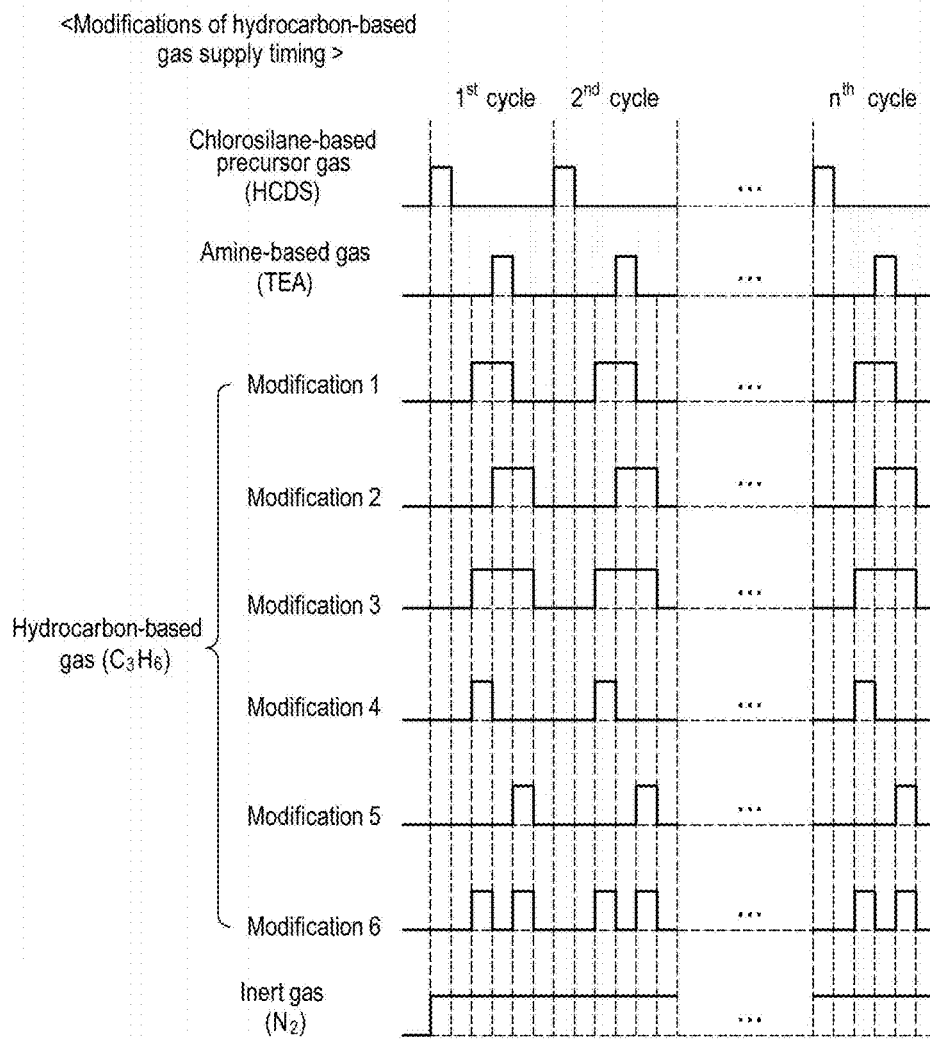

For example, as in a first modification shown in FIG. 5B, in Step 2, the process of supplying the $C_3H_6$ gas may be performed prior to the process of supplying the TEA gas and also be performed simultaneously with the process of supplying the TEA gas. That is, in Step 2, the process of supplying the $C_3H_6$ gas may be performed during the period prior to the initiation of the process of supplying the TEA gas and the supply period of the TEA gas, and may not be performed during the period after the termination of the process of supplying the TEA gas. In this case, processing conditions may also be similar to those of the above-described embodiment, for example.

Further, for example, as in a second modification shown in FIG. 5B, in Step 2, the process of supplying the $C_3H_6$ gas may be performed simultaneously with the process of supplying the TEA gas and also be performed after the termination of the process of supplying the TEA gas. That is, in Step 2, the process of supplying the $C_3H_6$ gas may not be performed during the period prior to the initiation of the process of supplying the TEA gas, but may be performed during the supply period of the TEA gas and the period after the termination of the process of supplying the TEA gas. In this case, processing conditions may also be similar to those of the above-described embodiment, for example.

Furthermore, for example, as in a third modification shown in FIG. 5B, in Step 2, the process of supplying the $C_3H_6$ gas may be performed prior to the process of supplying the TEA gas, also be performed simultaneously with the process of supplying the TEA gas, and also be performed after the termination of the process of supplying the TEA gas. That is, in Step 2, the process of supplying the $C_3H_6$ gas may be performed during the period prior to the initiation of the process of supplying the TEA gas, the supply period of the TEA gas, and the period after the termination of the process of supplying the TEA gas. In this case, processing conditions may also be similar to those of the above-described embodiment, for example.

In addition, for example, as in a fourth modification shown in FIG. 5B, in Step 2, the process of supplying the $C_3H_6$ gas may only be performed prior to the process of supplying the TEA gas, and may not be performed simultaneously with the process of supplying the TEA gas. That is, in Step 2, the process of supplying the $C_3H_6$ gas may be performed only during the period prior to the initiation of the process of supplying the TEA gas, but may not be performed during the supply period of the TEA gas and the period after the termination of the process of supplying the TEA gas. In this case, processing conditions may also be similar to those of the above-described embodiment, for example.

In addition, for example, as in a fifth modification shown in FIG. 5B, in Step 2, the process of supplying the $C_3H_6$ gas may not be performed simultaneously with the process of supplying the TEA gas, but may be only performed after the termination of the process of supplying the TEA gas. That is, in Step 2, the process of supplying the $C_3H_6$ gas may not be performed during the period prior to the initiation of the process of supplying the TEA gas and the supply period of the TEA gas, but may be performed only during the period after the termination of the process of supplying the TEA gas. In this case, processing conditions may also be similar to those of the above-described embodiment, for example.

Moreover, for example, as in a sixth modification shown in FIG. 5B, in Step 2, the process of supplying the $C_3H_6$ gas may be performed prior to the process of supplying the TEA gas, may not be performed simultaneously with the process of supplying the TEA gas, and may be performed after the termination of the process of supplying the TEA gas. That is, in Step 2, the process of supplying the $C_3H_6$ gas may not be performed during the supply period of the TEA gas, but may be respectively performed prior to the initiation of the process of supplying the TEA gas and after the termination of the supply thereof. In this case, processing conditions may also be similar to those of the above-described embodiment, for example.

These modifications also exhibit the same effects as the film forming sequence described above with reference to FIGS. 4 and 5A. That is, it is possible to increase the concentration of C in the SiCN film even if the process of supplying the $C_3H_6$ gas is performed not only during the supply period of the TEA gas but also during the supply stop period of the TEA gas. It is also possible to increase the concentration of C in the SiCN film even if the process of supplying the $C_3H_6$ gas is not performed during the supply period of the TEA gas but performed during the supply stop period of the TEA gas. Furthermore, since a ratio of an Si component, a C component, and an N component in the film can be more finely controlled, controllability of a composition ratio of the SiCN film can be improved.

For example, in the first to third modifications, it is possible to more increase the concentration of C in the SiCN film, as compared with the film forming sequence described above with reference to FIGS. 4 and 5A. That is, in these modifications, since the process of supplying the $C_3H_6$ gas is performed not only during the supply period of the TEA gas but also during the supply stop period of the TEA gas, it is possible to more increase the concentration of C in the SiCN film as compared with the film forming sequence in which the process of supplying the $C_3H_6$ gas is performed only during the supply period of the TEA gas.

Further, in the fourth to sixth modifications, it is possible to more improve the controllability of a composition ratio of the SiCN film, as compared with the film forming sequence described above with reference to FIGS. 4 and 5A. This is because in these modifications, the process of supplying the $C_3H_6$ gas is not performed during the supply period of the TEA gas, which also serves as a nitrogen source, but performed only during the supply stop period of the TEA gas. In this way, when the process of supplying the carbon source is solely performed, the addition of the C component into the initial layer, i.e., the addition of the C component into the SiCN film, can be performed independently from the addition of the N component. As a result, as compared with the other film forming sequences, in which the process of supplying the carbon source is performed simultaneously with the process of supplying the nitrogen source, while an increase in the concentration of N in the SiCN film is suppressed, an increase in the concentration of C in the film is facilitated.

Further, in the first, third, fourth and sixth modifications, it is easy to further increase the concentration of C in the SiCN film, as compared with the film forming sequence described above with reference to FIGS. 4 and 5A or the second and fifth modifications. This is because in each of the first, third, fourth and sixth modifications, the process of supplying the $C_3H_6$ gas is performed prior to the initiation of the process of supplying the TEA gas which also serves as the nitrogen source. As described above, when the process of supplying the carbon source is initiated prior to the process of supplying the nitrogen source, it is possible to efficiently add the C component into the initial layer. As a result, as compared with the other film forming sequences in which the process of supplying the $C_3H_6$ gas is initiated during or after the supply period of the TEA gas, it is possible to further increase the concentration of C in the SiCN film. However, in order to securely add the N component into the SiCN film, the process of supplying the TEA gas may be initiated before an adsorption reaction of molecules of the $C_3H_6$ gas or the like onto the initial layer is saturated, i.e., before the adsorption layer (chemisorption layer) of the $C_3H_6$ gas becomes a continuous layer (while the adsorption layer remains a discontinuous layer).

In these modifications, by appropriately adjusting the supply conditions (gas supply time, supply flow rate, internal pressure of the process chamber 201, partial pressure of the $C_3H_6$ gas and the like) in the process of supplying the $C_3H_6$ gas performed during the supply period and/or the supply stop period of the TEA gas, it is possible to finely control the concentration of C in the SiCN film.

For example, in Step 2, by setting the internal pressure of the process chamber 201 in the process of supplying the $C_3H_6$ gas performed during the supply stop period of the TEA gas to be greater than the internal pressure of the process chamber 201 in the process of supplying the TEA gas (during the supply period of the TEA gas), it is possible to more increase the concentration of C in the SiCN film. That is, by setting the internal pressure of the process chamber 201 in the process of supplying the $C_3H_6$ gas performed prior to the process of supplying the TEA gas to be greater than the internal pressure of the process chamber 201 in the process of supplying the TEA gas, it is possible to more increase the concentration of C in the SiCN film. In addition, by setting the internal pressure of the process chamber 201 in the process of supplying the $C_3H_6$ gas performed after the termination of the process of supplying the TEA gas to be greater than the internal pressure of the process chamber 201 in the process of supplying the TEA gas, the concentration of C in the SiCN film can be more increased.

Further, for example, in Step 2, by setting the internal pressure of the process chamber 201 in the process of supplying the $C_3H_6$ gas performed during the supply stop period of the TEA gas to be equal to or smaller than the internal pressure of the process chamber 201 in the process of supplying the TEA gas (during the supply period of the TEA gas), it is possible to appropriately suppress an increase in the concentration of C in the SiCN film. That is, by setting the internal pressure of the process chamber 201 in the process of supplying the $C_3H_6$ gas performed prior to the process of supplying the TEA gas to be equal to or smaller than the internal pressure of the process chamber 201 in the process of supplying the TEA gas, it is possible to appropriately suppress an increase in the concentration of C in the SiCN film. In addition, by setting the internal pressure of the process chamber 201 in the process of supplying the $C_3H_6$ gas performed after the termination of the process of supplying the TEA gas to be equal or smaller than the internal pressure of the process chamber 201 in the process of supplying the TEA gas, an increase in the concentration of C in the SiCN film can be appropriately suppressed.

Further, for example, in Step 2, by increasing the gas supply time or supply flow rate of the $C_3H_6$ gas in the process of supplying the $C_3H_6$ gas performed during the supply stop period of the TEA gas, it is possible to more increase the concentration of C in the SiCN film.

Furthermore, for example, in Step 2, by decreasing the gas supply time or supply flow rate of the $C_3H_6$ gas in the process of supplying the $C_3H_6$ gas performed during the supply stop period of the TEA gas, it is possible to appropriately suppress an increase in the concentration of C in the SiCN film.

According to these modifications, the concentration of C in the SiCN film can be increased even if the internal pressure of the process chamber 201, the supply time of the TEA gas, or the supply flow rate of the TEA gas in the process of supplying the TEA gas is not excessively increased. That is, while the supply conditions (gas supply time, supply flow rate, internal pressure of the process chamber 201, partial pressure of the TEA gas and the like) in the process of supplying the TEA gas are set to fall within appropriate ranges, by appropriately adjusting the supply conditions (gas supply time, supply flow rate, internal pressure of the process chamber 201, partial pressure of the $C_3H_6$ gas and the like) in the process of supplying the $C_3H_6$ gas performed during the supply stop period of the TEA gas, it is possible to increase the concentration of C in the SiCN film. In addition, since consumption of the TEA gas that is relatively expensive can be reduced, it is possible to reduce substrate processing costs.

Additional Embodiments of the Present Disclosure

Hereinabove, while the embodiments of the present disclosure have been specifically described, the present disclosure is not limited to the above-described embodiments and modifications and may be variously modified without departing from the spirit of the present disclosure.

For example, in the above-described embodiments and the like, it has been described as an example that the process of supplying the $C_3H_6$ gas is performed during the supply period and/or the supply stop period of the TEA gas, the present disclosure is not limited to the embodiments.

Figure 10A:
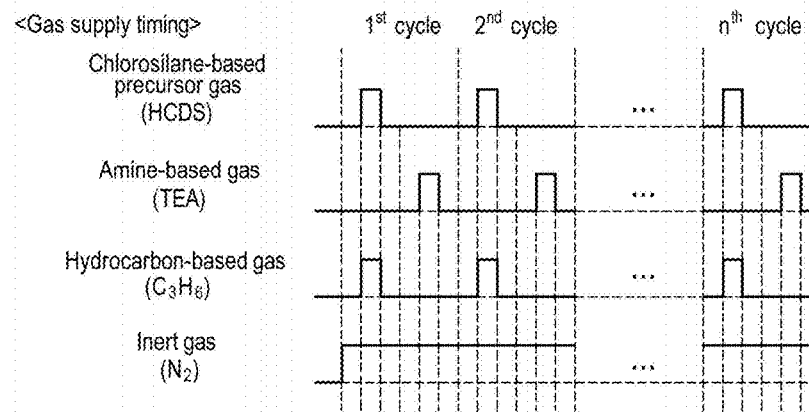
FIG. 10A is a view illustrating gas supply timings in a film forming sequence according to another embodiment of the present disclosure and FIG. 10B is a view illustrating gas supply timings in film forming sequences according to modifications thereof.

For example, as shown in FIG. 10A, the process of supplying the $C_3H_6$ gas may be performed simultaneously with the process of supplying the HCDS gas. Further, as in the first to third modifications shown in FIG. 10B, the process of supplying the $C_3H_6$ gas may be performed not only during the supply period of the HCDS gas but also during the supply stop period of the HCDS gas (during the period prior to the initiation of the process of supplying the HCDS gas and/or the period after the termination of the process of supplying the HCDS gas). In addition, as in the fourth to sixth modifications shown in FIG. 10B, the process of supplying the $C_3H_6$ gas may not be performed during the supply period of the HCDS gas, but performed during the supply stop period of the HCDS gas (during the period prior to the initiation of the process of supplying the HCDS gas and/or the period after the termination of the process of supplying the HCDS gas). In these cases, processing conditions may also be similar to those of the above-described embodiment, for example.

Since the concentration of C in the SiCN film can be increased even in these cases, the controllability of a composition ratio of the SiCN film can be improved. Particularly, in the first to third modifications shown in FIG. 10B, it is possible to more increase the concentration of C in the SiCN film. Further, in the fourth to sixth modifications shown in FIG. 10B, the controllability of a composition ratio of the SiCN film can be more improved. Further, in the fourth to sixth modifications, as compared with the other film forming sequences shown in FIG. 10B, since it is easy to allow the HCDS gas or the $C_3H_6$ gas to appropriately react under conditions where a surface reaction is dominant, the film thickness controllability can also be increased. Further, in the fourth to sixth modifications, since it is easy to avoid a gas phase reaction of the HCDS gas and the $C_3H_6$ gas in the process chamber 201, the generation of particles in the process chamber 201 can also be suppressed. Furthermore, in the first, third, fourth and sixth modifications shown in FIG. 10B, it is easy to more increase the concentration of C in the SiCN film as compared with the other film forming sequences shown in FIG. 10B. However, in order to securely form the Si-containing layer containing Cl on the wafer 200, the process of supplying the HCDS gas may be initiated before an adsorption reaction of molecules of the $C_3H_6$ gas or the like onto the wafer 200 is saturated, i.e., before the adsorption layer (chemisorption layer) of the $C_3H_6$ gas becomes a continuous layer (while the adsorption layer remains a discontinuous layer).

Figure 10B:
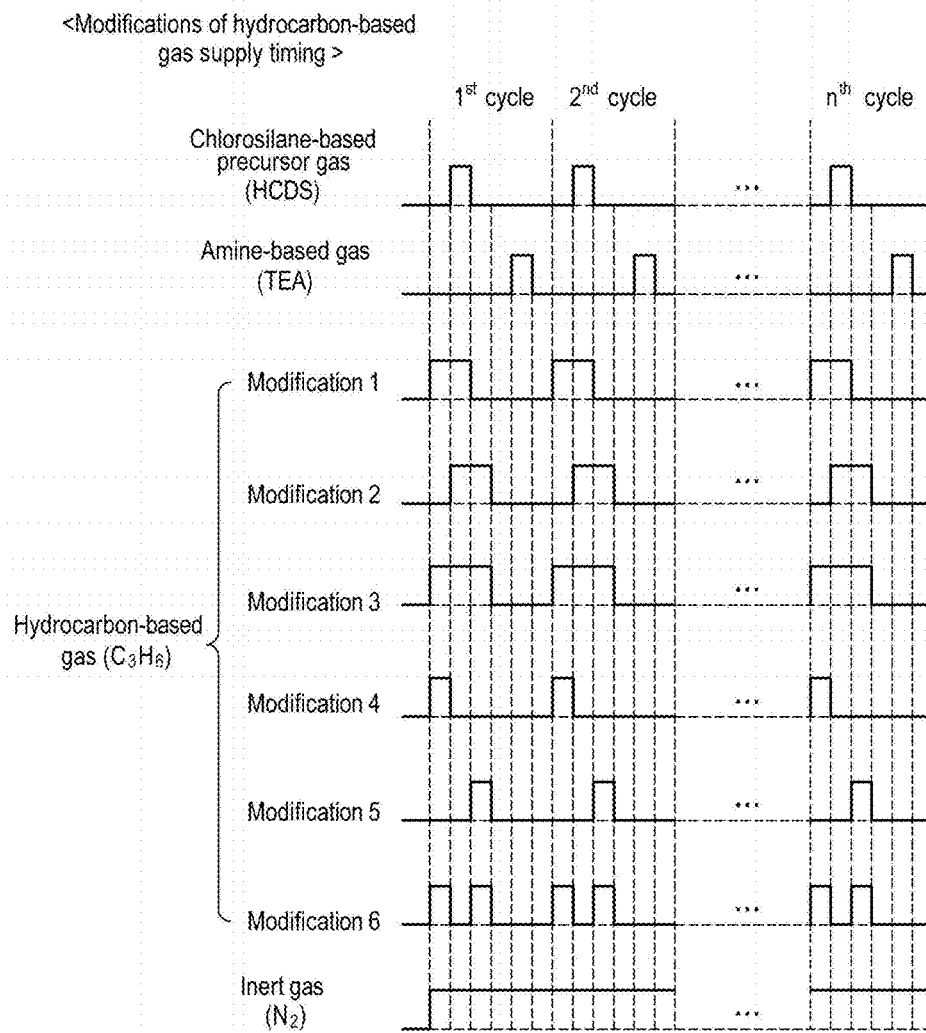

As described above, even in each film forming sequence shown in FIGS. 10A and 10B, the same functional effects as each film forming sequence shown in FIGS. 5A and 5B can be obtained. However, each film forming sequence shown in FIGS. 5A and 5B may be desirable as compared with each film forming sequence shown in FIGS. 10A and 10B in that the film thickness controllability can be increased since it is possible to allow the HCDS gas or the $C_3H_6$ gas to appropriately react under conditions where a surface reaction is dominant. Further, each film forming sequence shown in FIGS. 5A and 5B may also be desirable in that the generation of particles in the process chamber 201 can be suppressed since the HCDS gas and the $C_3H_6$ gas are not mixed in the process chamber 201 to avoid a gas phase reaction of the HCDS gas and the $C_3H_6$ gas in the process chamber 201.

Further, for example, in the above-described embodiment, it has been described as an example that when the SiCN layer is formed, the chlorosilane-based precursor gas is supplied to the wafer 200 and then the amine-based gas and the hydrocarbon-based gas are supplied thereto, the supply order of these gases may be reversed. For example, after the amine-based gas and the hydrocarbon-based gas are supplied, the chlorosilane-based precursor gas may be supplied. As such, after any one of the chlorosilane-based precursor gas, and the amine-based gas and hydrocarbon-based gas is first supplied, the other gases may be supplied. In this way, by changing the gas supply order, film quality or a composition ratio of the thin film formed can be varied.

Furthermore, for example, in the above-described embodiment, while it has been described as an example that the chlorosilane-based precursor gas is used as the first processing gas when the initial layer is formed in Step 1, a silane-based precursor gas having a halogen-based ligand other than a chloro group may be used instead of the chlorosilane-based precursor gas. For example, a fluorosilane-based precursor gas may be used instead of the chlorosilane-based precursor gas. Here, the fluorosilane-based precursor gas refers to a fluorosilane-based precursor in a gaseous state, for example, a gas obtained by vaporizing a fluorosilane-based precursor that is in a liquid state under normal temperature and pressure, a fluorosilane-based precursor that is in a gaseous state under normal temperature and pressure, or the like. In addition, the fluorosilane-based precursor refers to a silane-based precursor containing a fluoro group as a halogen group, and a precursor containing at least silicon (Si) and fluorine (F). That is, the fluorosilane-based precursor described herein may also refer to a type of a halide. The fluorosilane-based precursor gas may include, for example, a silicon fluoride gas such as tetrafluorosilane, i.e., a silicon tetrafluoride ($SiF_4$) gas, or a hexafluoro disilane ($Si_2F_6$) gas. In this case, when an initial layer containing a predetermined element and a halogen element is formed, the fluorosilane-based precursor gas is supplied to the wafer 200. Here, the initial layer becomes a layer containing Si and F, i.e., an Si-containing layer containing F.

Further, for example, in the above-described embodiment, it has been described as an example that the amine-based gas is used as the second processing gas when the initial layer is changed (modified) into the SiCN layer. However, a gas containing an organic hydrazine compound, i.e., an organic hydrazine-based gas, for example, may be used as the second processing gas. The gas containing an organic hydrazine compound may also be simply referred to as an organic hydrazine compound gas, or an organic hydrazine gas. Here, the organic hydrazine-based gas refers to a gas containing a hydrazine group, such as an organic hydrazine in a gaseous state, for example, a gas obtained by vaporizing an organic hydrazine that is in a liquid state under normal temperature and pressure, an organic hydrazine that is in a gaseous state under normal temperature and pressure, or the like. The organic hydrazine-based gas is a silicon (Si)-free gas composed of three elements of carbon (C), nitrogen (N) and hydrogen (H), and furthermore, an Si- and metal-free gas. The organic hydrazine-based gas may include, for example, a methylhydrazine-based gas obtained by vaporizing monomethylhydrazine (($CH_3$)$HN_2H_2$, abbreviation: MMH), dimethylhydrazine (($CH_3$)$_2N_2H_2$, abbreviation: DMH), trimethyl hydrazine (($CH_3$)$_2N_2(CH_3$)H, abbreviation: TMH) or the like, and an ethylhydrazine-based gas obtained by vaporizing ethylhydrazine (($C_2H_5$)$HN_2H_2$, abbreviation: EH) or the like. In this case, when the initial layer is changed (modified) into the SiCN layer, the organic hydrazine-based gas and the hydrocarbon-based gas are supplied to the wafer 200. A gas composed of three elements of C, N and H and having one or more C atoms greater than in number than a N atom(s) in its composition formula (in one molecule in its constitutional formula) may be used as the organic hydrazine-based gas. In addition, a gas having a plurality of ligands containing C atoms in its composition formula, i.e., a gas having a plurality of hydrocarbon groups such as alkyl groups, or the like in its composition formula, may be used as the organic hydrazine-based gas. Specifically, a gas having three or two ligands containing C atoms (hydrocarbon groups such as alkyl groups, or the like) in its composition formula may be used as the organic hydrazine-based gas.

Moreover, for example, in the above-described embodiment, it has been described as an example that when the SiCN layer is formed, the chlorosilane-based precursor gas is supplied to the wafer 200 and then the amine-based gas and the hydrocarbon-based gas are supplied thereto. However, the chlorosilane-based precursor gas and the amine-based gas and the hydrocarbon-based gas are simultaneously supplied to the wafer 200 to cause a CVD reaction. In this way, even if the chlorosilane-based precursor gas and the amine-based gas and the hydrocarbon-based gas are not sequentially but simultaneously supplied to the wafer 200, the same functional effects as the above-described embodiment may be obtained. However, in the same manner as the above-described embodiment, the chlorosilane-based precursor gas, and the amine-based gas and the hydrocarbon-based gas may be alternately supplied with the purge of the process chamber 201 interposed therebetween in that the film thickness controllability can be improved since the chlorosilane-based precursor gas, or the amine-based gas and the hydrocarbon-based gas may be appropriately reacted under conditions where a surface reaction is dominant. In addition, since it is easy to avoid a gas phase reaction of the chlorosilane-based precursor gas, and the amine-based gas and the hydrocarbon-based gas in the process chamber 201, the generation of particles in the process chamber 201 can be suppressed.

As the silicon-based insulating film formed according to the method of the above-described embodiments or modifications may be used as a sidewall spacer, a device forming technique having a small leak current and good machinability can be provided.

In addition, as the silicon-based insulating film formed according to the method of the above-described embodiments or modifications may be used as an etching stopper, a device forming technique having good machinability can be provided.

According to the above-described embodiments and modifications, a silicon-based insulating film having an ideal stoichiometric ratio can be formed without using plasma even in a low temperature region. In addition, since the silicon-based insulating film can be formed without using plasma, for example, the features of present disclosure can be applied to a process having probability of plasma damage, for example, an SADP film of DPT.

In addition, in the above-described embodiments, while it has been described as an example that the silicon-based insulating film (SiCN film) containing Si that is a semiconductor element, as a carbonitride film containing a predetermined element, is formed, the features of the present disclosure can be applied to a case in which a metal-based thin film containing a metal element such as titanium (Ti), zirconium (Zr), hafnium (Hf), tantalum (Ta), aluminum (Al), molybdenum (Mo), or the like is formed.

That is, the features of the present disclosure may be appropriately applied, for example, to a case in which a metal carbonitride film, such as a titanium carbonitride film (TiCN film), a zirconium carbonitride film (ZrCN film), a hafnium carbonitride film (HfCN film), a tantalum carbonitride film (TaCN film), an aluminum carbonitride film (AlCN film), or a molybdenum carbonitride film (MoCN film) is formed.

In such a case, a precursor gas containing a metal element and a halogen element may be used as a first precursor gas instead of the chlorosilane-based precursor gas of the above-described embodiment, and a film may be formed in the same sequence as the above-described embodiment. That is, a film containing a metal element, carbon and nitrogen as a metal-based thin film may be formed on the wafer 200 by performing a cycle a predetermined number of times (one or more times), the cycle including: a process of supplying a first processing gas containing the metal element and a halogen element to the wafer 200; a process of supplying a second processing gas composed of three elements of carbon, nitrogen and hydrogen to the wafer 200; and a process of supplying a third processing gas containing carbon to the wafer 200.

For example, in a case where a metal-based thin film (TiCN film) is formed, a precursor gas containing Ti and a chloro group such as titanium tetrachloride ($TiCl_4$) or a precursor gas containing Ti and a fluoro group such as titanium tetrafluoride ($TiF_4$) may be used as the first processing gas. The same gases as those of the above-described embodiment may be used as the second and third processing gases. The processing conditions in this case may also be the same, for example, as the processing conditions of the above-described embodiments.

Also, for example, in a case where a metal-based thin film (ZrCN film) is formed, a precursor gas containing Zr and a chloro group such as zirconium tetrachloride ($ZrCl_4$) or a precursor gas containing Zr and a fluoro group such as zirconium tetrafluoride ($ZrF_4$) may be used as the first processing gas. The same gases as those of the above-described embodiment may be used as the second and third processing gases. The processing conditions in this case may also be the same, for example, as the processing conditions of the above-described embodiments.

In addition, for example, in a case where a metal-based thin film (HfCN film) is formed, a precursor gas containing Hf and a chloro group such as hafnium tetrachloride ($HfCl_4$) or a precursor gas containing Hf and a fluoro group such as hafnium tetrafluoride ($HfF_4$) may be used as the first processing gas. The same gases as those of the above-described embodiment may be used as the second and third processing gases. The processing conditions in this case may also be the same, for example, as the processing conditions of the above-described embodiments.

Further, for example, in a case where a metal-based thin film (TaCN film) is formed, a precursor gas containing Ta and a chloro group such as tantalum pentachloride ($TaCl_5$) or a precursor gas containing Ta and a fluoro group such as tantalum pentafluoride ($TaF_5$) may be used as the first processing gas. The same gases as those of the above-described embodiment may be used as the second and third processing gases. The processing conditions in this case may also be the same, for example, as the processing conditions of the above-described embodiments.

Furthermore, for example, in a case where a metal-based thin film (AlCN film) is formed, a precursor gas containing Al and a chloro group such as aluminum trichloride ($AlCl_3$) or a precursor gas containing Al and a fluoro group such as aluminum trifluoride ($AlF_3$) may be used as the first processing gas. The same gases as those of the above-described embodiment may be used as the second and third processing gases. The processing conditions in this case may also be the same, for example, as the processing conditions of the above-described embodiments.

Moreover, for example, in a case where a metal-based thin film (MoCN film) is formed, a precursor gas containing Mo and a chloro group such as molybdenum pentachloride ($MoCl_5$) or a precursor gas containing Mo and a fluoro group such as molybdenum pentafluoride ($MoF_5$) may be used as the first processing gas. The same gases as those of the above-described embodiment may be used as the second and third processing gases. The processing conditions in this case may also be the same, for example, as the processing conditions of the above-described embodiments.

That is, the features of the present disclosure may be appropriately applied to a case in which a thin film containing a predetermined element such as a semiconductor element or a metal element is formed.

In addition, a plurality of process recipes (programs describing processing procedures, processing conditions or the like written) used in forming a variety of the thin films may be individually prepared according to substrate processing types (the type of film to be formed, a composition ratio, a film quality, a film thickness and the like). In addition, when the substrate processing is initiated, a suitable process recipe among the plurality of process recipes may be appropriately selected according to a substrate processing type. Specifically, the plurality of process recipes individually prepared according to substrate processing types may be previously stored (installed) in the memory device 121*c* provided in the substrate processing apparatus through an electrical communication line or a recording medium (e.g., the external memory device 123) in which the process recipes are recorded. In addition, when the substrate processing is initiated, the CPU 121*a* provided in the substrate processing apparatus may appropriately select a suitable process recipe among the plurality of process recipes stored in the memory device 121*c* according to a substrate processing type. With this configuration, thin films having a variety of film types, composition ratios, film qualities and film thicknesses can be formed with high versatility and high reproducibility in one substrate processing apparatus. In addition, this configuration can reduce an operator's work load (a load of inputting processing procedures or processing conditions, or the like), thereby rapidly initiating the substrate processing while avoiding an operational error.

The above-described process recipe is not limited to a newly prepared recipe and may be prepared, for example, by modifying an existing process recipe that is already installed in the substrate processing apparatus. When the process recipe is modified, the modified process recipe may be installed to the substrate processing apparatus through an electrical communication line or a recording medium in which the process recipe is recorded. In addition, the process recipe previously installed in the existing substrate processing apparatus may be directly changed by manipulating the input/output device 122 of the substrate processing apparatus.

It has been described as an example in the above-described embodiments that a thin film is formed using a batch type substrate processing apparatus in which a plurality of substrates are processed at a time. The present disclosure is not limited to the above-described embodiments but may be applied to a case in which a thin film is formed using a single-wafer type substrate processing apparatus in which one or several substrates are processed at a time, for example. In addition, it has been described as an example in the above-described embodiments that the substrate processing apparatus having the hot wall type processing furnace is used to form a thin film. The present disclosure is not limited to the above-described embodiments but may be appropriately applied to a case in which a substrate processing apparatus having a cold wall type processing furnace is used to form a thin film. In these cases, processing conditions may also be similar to those of the above-described embodiments, for example.

In addition, the above-described embodiments, modifications, or applications may be appropriately combined and used. In these cases, processing conditions may also be similar to those of the above-described embodiments, for example.

EXAMPLE

Example 1

In Example 1 of the present disclosure, SiCN films were formed on a plurality of wafers by the film forming sequence of the above-described embodiment using the substrate processing apparatus of the above-described embodiment. The HCDS gas was used as the first processing gas, the TEA gas was used as the second processing gas, and the $C_3H_6$ gas was used as the third processing gas. In Step 2, the $C_3H_6$ gas was supplied at the gas supply timings shown in the third modification of FIG. 5B. That is, the process of supplying the $C_3H_6$ gas was respectively performed during the period prior to the initiation of the process of supplying the TEA gas (the supply stop period thereof), the supply period of the TEA gas, and the period after the termination of the process of supplying the TEA gas (the supply stop period thereof). The wafer temperature when the film was formed was set to fall within a range of 600 to 650 degrees C. The other processing conditions were set to fall within ranges of the processing conditions described in the above embodiment.

In addition, a film thickness distribution, an in-plane average film thickness, a film thickness uniformity in a wafer surface (hereinafter, referred to as WiW), a refractive index (hereinafter, referred to as R.I.) and an RMS roughness (surface roughness) of the SiCN film according to Example 1 were respectively measured.

Figure 6:
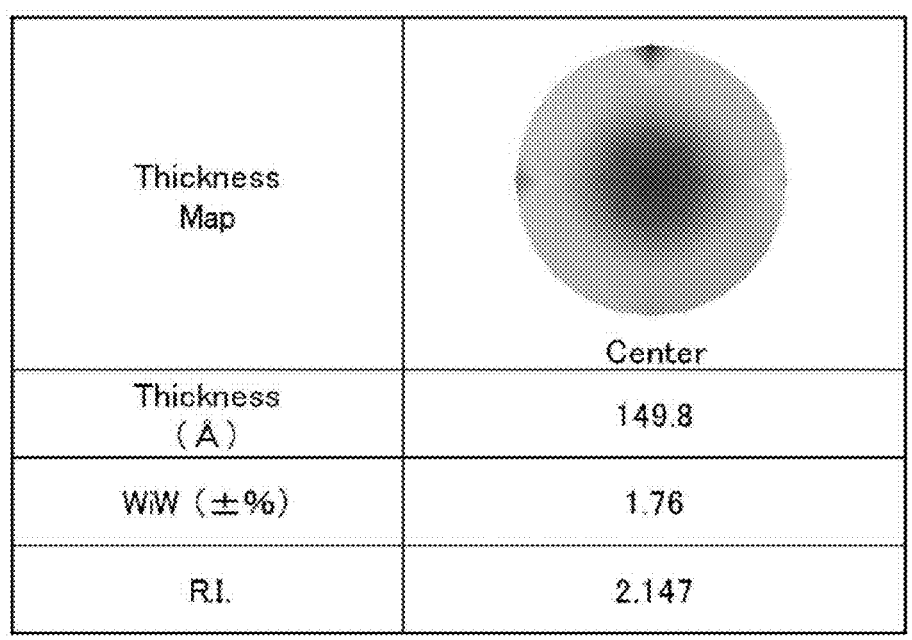
FIG. 6 is a diagram illustrating measurement results of a film thickness distribution, an in-plane average film thickness, an in-plane film thickness uniformity, and a refractive index of an SiCN film according to Example 1.

FIG. 6 is a diagram illustrating measurement results of a film thickness distribution, an in-plane average film thickness, a WiW and an R. I. of the SiCN film formed on a wafer disposed in a central portion (Center) of the boat. As shown in FIG. 6, the SiCN film according to Example 1 had a desirable film thickness distribution, i.e., an average film thickness of 149.8 Å, a WiW of ±1.76%, and an R. I. of 2.147. That is, it was confirmed that the SiCN film according to Example 1 had desirable film thickness uniformity in the wafer surface and an appropriate R. I. value.

Figure 7:
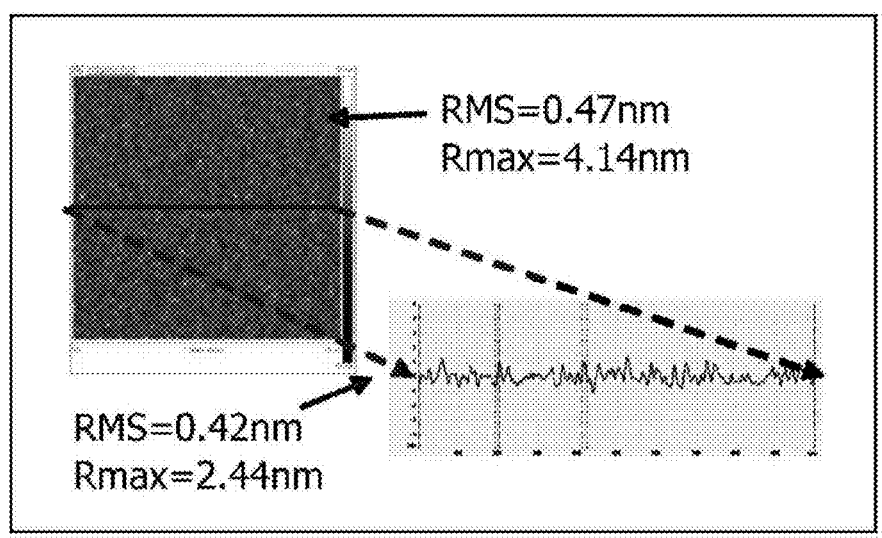
FIG. 7 is a diagram illustrating a measurement result of an RMS roughness of the SiCN film according to Example 1.

FIG. 7 is a diagram illustrating a measurement result of an RMS roughness of the SiCN film according to Example 1. An RMS roughness of a smaller value shows that a surface is more uniform, whereas an RMS roughness of a larger value shows that a surface is rougher. As shown in FIG. 7, the SiCN film according to Example 1 had an RMS roughness of 0.47 nm or less. That is, it was confirmed that the SiCN film according to Example 1 has a highly flat surface.

Example 2

In Example 2 of the present disclosure, SiCN films were formed on a plurality of wafers by the film forming sequence of the above-described embodiment using the substrate processing apparatus of the above-described embodiment. A processing sequence and processing conditions when the film was formed were similar to the processing sequence and processing conditions of Example 1.

In addition, as Comparative Example, SiCN films were formed on a plurality of wafers by a film forming sequence of performing a cycle a predetermined number of times, the cycle including performing a step of supplying the HCDS gas to the wafers and a step of supplying the TEA gas to the wafers in the this order, using the substrate processing apparatus of the above-described embodiment. In Comparative Example, a step of supplying the $C_3H_6$ gas to the wafers was not performed. The wafer temperature when the film was formed was set to fall within a range of 600 to 650 degrees C. The other processing conditions were set to fall within ranges of the processing conditions described in the above embodiment.

Then, an X-ray photoelectron spectroscopy (XPS) composition and a resistance to hydrogen fluoride (HF) of each film were measured. These measurement results are shown in FIGS. 8 and 9, respectively.

Figure 8:
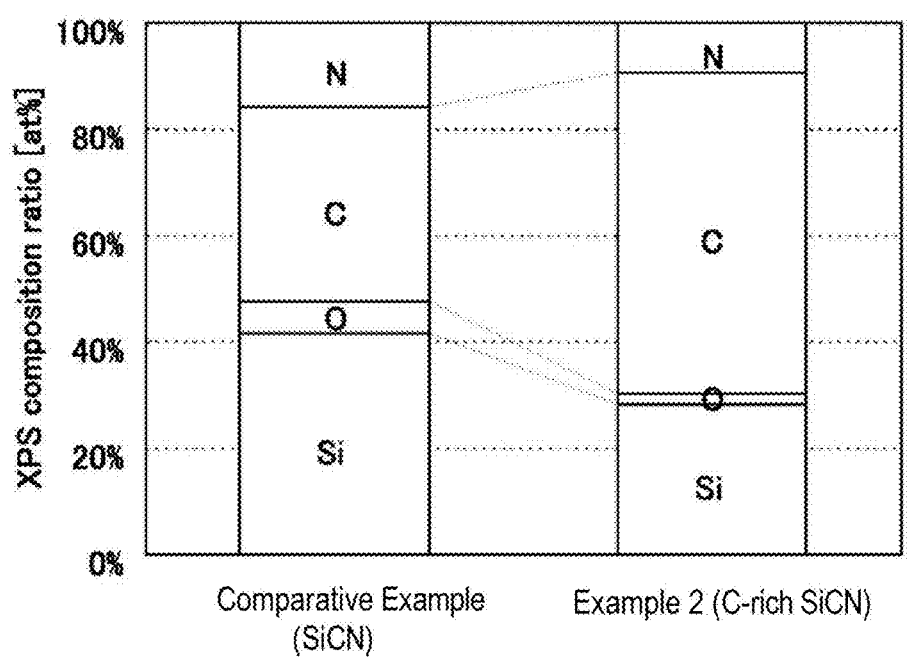
FIG. 8 is a diagram illustrating XPS measurement results of SiCN films according to Example 2 and Comparative Example.

FIG. 8 is a diagram illustrating XPS measurement results of the SiCN films according to Example 2 and Comparative Example. The transverse axis of FIG. 8 represents the film according to Comparative Example and the film according to Example 2 in this order. The vertical axis of FIG. 8 represents concentrations [at %] of Si, O, C, and N in the films measured by an XPS. Further, an O component was detected in both films and at an impurity level, which may be caused by a native oxide film formed in an interface between the SiCN film and its base or on a surface of the SiCN film. According to FIG. 8, it can be seen that the SiCN film according to Example 2 has a lower concentration of N in the film and a higher concentration of C therein than the SiCN film according to Comparative Example. That is, it can be seen that it is possible to increase the concentration of C in the SiCN film while suppressing an increase in the concentration of N therein, i.e., to form the C-rich SiCN film, by respectively performing the process of supplying the $C_3H_6$ gas during the period prior to the initiation of the process of supplying the TEA gas (the supply stop period thereof), the supply period of the TEA gas, and the period after the termination of the process of supplying the TEA gas (the supply stop period thereof).

Figure 9:
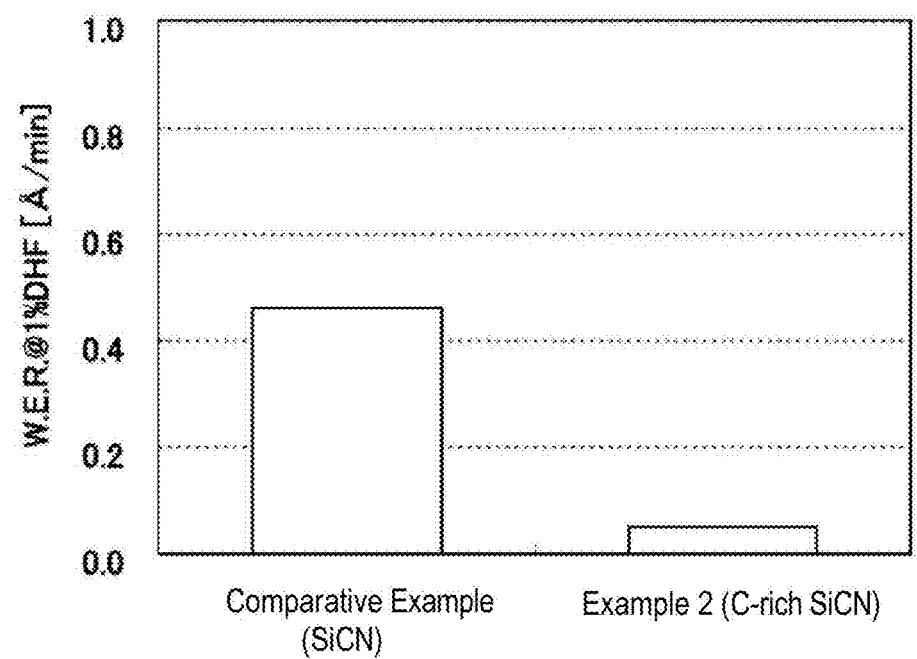
FIG. 9 is a diagram illustrating a measurement result of a resistance to hydrogen fluoride of the SiCN films according to Example 2 and Comparative Example.

FIG. 9 is a diagram illustrating a measurement result of a resistance to HF of the SiCN films according to Example 2 and Comparative Example. The transverse axis of FIG. 9 represents the film according to Comparative Example and the film according to Example 2 in this order. The vertical axis of FIG. 9 represents a wet etching rate (hereinafter, referred to as W. E. R.) [Å/min], i.e., a resistance to HF of the film when a film was etched with the HF-containing solution of a concentration of 1%. According to FIG. 9, it can be seen that the SiCN film according to Example 2 has a smaller W. E. R. than the SiCN film according to Comparative Example. That is, it can be seen that the SiCN film according to Example 2 has a higher resistance to HF than the SiCN film according to Comparative Example. This may be because the SiCN film according to Example 2 has a higher concentration of C in the film than that in the SiCN film according to Comparative Example.

(Others)

In the above-described Examples 1 and 2, it was confirmed that it was possible to finely control the concentration of C in the SiCN film while suppressing an increase in the concentration of N in the SiCN film by appropriately controlling the supply conditions (gas supply time, supply flow rate, internal pressure of the process chamber, partial pressure of the $C_3H_6$ gas and the like) in the process of supplying the $C_3H_6$ gas respectively performed during the supply period and/or the supply stop period of the TEA gas.

In addition, it has been described as an example in each of the above-described Examples 1 and 2 that the SiCN film was formed by supplying the $C_3H_6$ gas at the gas supply timings shown in the third modification of FIG. 5B. However, it was confirmed that the same types of effects as the above-described Examples 1 and 2 were obtained even if the SiCN films were formed by supplying the $C_3H_6$ gas at the other gas supply timings shown in FIGS. 5A and 5B. Furthermore, it was also confirmed that the same types of effects as the above-described Examples 1 and 2 were obtained even if the SiCN films were formed by supplying the $C_3H_6$ gas at various gas supply timings shown in FIGS. 10A and 10B.

Aspects of the Present Disclosure

Hereinafter, some aspects of the present disclosure will be additionally stated.

(Supplementary Note 1)

According to an aspect of the present disclosure, there is provided a method of manufacturing a semiconductor device, including forming a film containing a predetermined element, carbon and nitrogen (a carbonitride film containing the predetermined element) on a substrate by performing a cycle a predetermined number of times, the cycle including: supplying a first processing gas containing the predetermined element and a halogen element to the substrate; supplying a second processing gas composed of three elements of carbon, nitrogen and hydrogen to the substrate; and supplying a third processing gas containing carbon to the substrate.

(Supplementary Note 2)

In the method of manufacturing a semiconductor device according to Supplementary Note 1, supplying the third processing gas is performed during a period in which the second processing gas is supplied.

(Supplementary Note 3)

In the method of manufacturing a semiconductor device according to Supplementary Note 1 or 2, supplying the third processing gas is performed during a period in which supplying the second processing gas is stopped.

(Supplementary Note 4)

In the method of manufacturing a semiconductor device according to any one of Supplementary Notes 1 to 3, supplying the third processing gas is performed simultaneously with supplying the second processing gas.

(Supplementary Note 5)

In the method of manufacturing a semiconductor device according to any one of Supplementary Notes 1 to 4, supplying the third processing gas is performed prior to supplying the second processing gas.

(Supplementary Note 6)

In the method of manufacturing a semiconductor device according to any one of Supplementary Notes 1 to 5, supplying the third processing gas is performed after supplying the second processing gas is terminated.

(Supplementary Note 7)

In the method of manufacturing a semiconductor device according to any one of Supplementary Notes 1 to 6, forming the film is performed under a state where the substrate is accommodated in a process chamber, and an internal pressure of the process chamber in the act of supplying the third processing gas is performed during the period in which supplying the second processing gas is stopped is set to be greater (higher) than an internal pressure of the process chamber in the act of supplying the second processing gas (during the period in which the second processing gas is supplied).

(Supplementary Note 8)

In the method of manufacturing a semiconductor device according to any one of Supplementary Notes 1 to 7, forming the film is performed under a state where the substrate is accommodated in a process chamber, and an internal pressure of the process chamber in the act of supplying the third processing gas is performed prior to supplying the second processing gas is set to be greater than an internal pressure of the process chamber in the act of supplying the second processing gas.

(Supplementary Note 9)

In the method of manufacturing a semiconductor device according to any one of Supplementary Notes 1 to 8, forming the film is performed under a state where the substrate is accommodated in a process chamber, and an internal pressure of the process chamber in the act of supplying the third processing gas is performed after supplying the second processing gas is terminated is set to be greater than an internal pressure of the process chamber in the act of supplying the second processing gas.

(Supplementary Note 10)

In the method of manufacturing a semiconductor device according to any one of Supplementary Notes 1 to 9, a carbon concentration in the film is adjusted by controlling a supply condition (supply time, supply flow rate, and partial pressure of the third processing gas, and internal pressure of the process chamber) of the third processing gas in the act of supplying the third processing gas.

(Supplementary Note 11)

In the method of manufacturing a semiconductor device according to any one of Supplementary Notes 1 to 10, the second processing gas includes a gas in which the number of carbon atom is greater than that of nitrogen atom in one molecule in its composition formula (in one molecule in its constitutional formula).

(Supplementary Note 12)

In the method of manufacturing a semiconductor device according to any one of Supplementary Notes 1 to 11, the second processing gas includes a gas having a plurality of ligands containing carbon atoms in one molecule in its composition formula (in one molecule in its constitutional formula).

(Supplementary Note 13)

In the method of manufacturing a semiconductor device according to any one of Supplementary Notes 1 to 12, the second processing gas includes at least one selected from a group consisting of an amine and an organic hydrazine.

(Supplementary Note 14)

In the method of manufacturing a semiconductor device according to any one of Supplementary Notes 1 to 13, the third processing gas includes a gas composed of two elements of carbon and hydrogen.

(Supplementary Note 15)

In the method of manufacturing a semiconductor device according to any one of Supplementary Notes 1 to 14, the third processing gas includes a hydrocarbon-based gas.

(Supplementary Note 16)

In the method of manufacturing a semiconductor device according to any one of Supplementary Notes 1 to 15, the predetermined element includes silicon or metal, and the halogen element includes chlorine or fluorine.

(Supplementary Note 17)

According to another aspect of the present disclosure, there is provided a method of processing a substrate, including forming a film containing a predetermined element, carbon and nitrogen on the substrate by performing a cycle a predetermined number of times, the cycle including: supplying a first processing gas containing the predetermined element and a halogen element to the substrate; supplying a second processing gas composed of three elements of carbon, nitrogen and hydrogen to the substrate; and supplying a third processing gas containing carbon to the substrate.

(Supplementary Note 18)

According to still another aspect of the present disclosure, there is provided a substrate processing apparatus, including: a process chamber configured to accommodate a substrate; a first gas supply system configured to supply a first processing gas containing a predetermined element and a halogen element into the process chamber; a second gas supply system configured to supply a second processing gas composed of three elements of carbon, nitrogen and hydrogen into the process chamber; a third gas supply system configured to supply a third processing gas containing carbon into the process chamber; and a control unit configured to control the first gas supply system, the second gas supply system and the third gas supply system to form a film containing the predetermined element, carbon and nitrogen on the substrate in the process chamber by performing a cycle a predetermined number of times, the cycle including: supplying the first processing gas to the substrate in the process chamber; supplying the second processing gas to the substrate in the process chamber; and supplying the third processing gas to the substrate in the process chamber.

(Supplementary Note 19)

According to still another aspect of the present disclosure, there are provided a program and a non-transitory computer-readable recording medium storing the program that causes a computer to perform a process of forming a film containing a predetermined element, carbon and nitrogen on a substrate in a process chamber (of a substrate processing apparatus) by performing a cycle a predetermined number of times, the cycle including: supplying a first processing gas containing the predetermined element and a halogen element to the substrate in the process chamber; supplying a second processing gas composed of three elements of carbon, nitrogen and hydrogen to the substrate in the process chamber; and supplying a third processing gas containing carbon to the substrate in the process chamber.

According to the present disclosure in some embodiments, it is possible to increase controllability of a composition of a film containing a predetermined element, carbon and nitrogen when the film is formed.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a film containing a predetermined element, carbon and nitrogen on a substrate in a process chamber by performing a cycle a predetermined number of times, the cycle comprising:
   supplying a first processing gas containing the predetermined element and a halogen element to the substrate in the process chamber;
   supplying a second processing gas composed of three elements of carbon, nitrogen and hydrogen to the substrate in the process chamber; and
   supplying a third processing gas containing carbon to the substrate in the process chamber, the third processing gas being different from the second processing gas,
   wherein a partial pressure of the third processing gas in the process chamber is set to be higher than a partial pressure of the second processing gas in the process chamber.

2. The method of claim 1, wherein supplying the third processing gas is performed during a period in which the second processing gas is supplied.

3. The method of claim 2, wherein an internal pressure of the process chamber in the act of supplying the third processing gas is set to be greater than an internal pressure of the process chamber in the act of supplying the first processing gas.

4. The method of claim 1, wherein supplying the third processing gas is performed during a period in which supplying the second processing gas is stopped.

5. The method of claim 4, wherein an internal pressure of the process chamber in the act of supplying the third processing gas is set to be greater than an internal pressure of the process chamber in the act of supplying the second processing gas.

6. The method of claim 1, wherein supplying the third processing gas is performed simultaneously with supplying the second processing gas.

7. The method of claim 1, wherein supplying the third processing gas is performed prior to supplying the second processing gas.

8. The method of claim 7, wherein an internal pressure of the process chamber in the act of supplying the third processing gas is set to be greater than an internal pressure of the process chamber in the act of supplying the second processing gas.

9. The method of claim 7, wherein the act of supplying the second processing gas is initiated before an adsorption reaction of the third processing gas is saturated.

10. The method of claim 1, wherein supplying the third processing gas is performed after supplying the second processing gas is terminated.

11. The method of claim 10, wherein an internal pressure of the process chamber in the act of supplying the third processing gas is set to be greater than an internal pressure of the process chamber in the act of supplying the second processing gas.

12. The method of claim 1, wherein the second processing gas comprises at least one selected from a group consisting of an amine and an organic hydrazine.

13. The method of claim 1, wherein the third processing gas comprises a gas composed of two elements of carbon and hydrogen.

14. The method of claim 1, wherein the third processing gas comprises a hydrocarbon-based gas.

15. The method of claim 1, wherein the predetermined element comprises silicon or metal, and the halogen element comprises chlorine or fluorine.

16. The method of claim 1, wherein, in the cycle, the act of supplying the third processing gas is initiated prior to the act of supplying the second processing gas, and is stopped after the supply of the second processing gas is terminated.

17. The method of claim 1, wherein, in the cycle, the act of supplying the third processing gas is performed at least one time of before and after the act of supplying the second processing gas.

* * * * *